(12) United States Patent
Lee et al.

(10) Patent No.: US 11,468,704 B2
(45) Date of Patent: Oct. 11, 2022

(54) FINGERPRINT SENSOR AND DISPLAY DEVICE INCLUDING THE SAME

(71) Applicant: SAMSUNG DISPLAY CO., LTD., Yongin-si (KR)

(72) Inventors: Sun Hwa Lee, Yongin-si (KR); Mu Kyung Jeon, Ulsan (KR); Kyung Hoon Chung, Yongin-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 0 days.

(21) Appl. No.: 17/336,995

(22) Filed: Jun. 2, 2021

(65) Prior Publication Data
US 2022/0058362 A1 Feb. 24, 2022

(30) Foreign Application Priority Data
Aug. 20, 2020 (KR) .................. 10-2020-0104575

(51) Int. Cl.
*G06V 40/13* (2022.01)
*H01L 27/146* (2006.01)
*H01L 31/12* (2006.01)
*G06V 10/145* (2022.01)
*G06V 10/147* (2022.01)

(52) U.S. Cl.
CPC ........ *G06V 40/1318* (2022.01); *G06V 10/145* (2022.01); *G06V 10/147* (2022.01); *H01L 27/14612* (2013.01); *H01L 31/12* (2013.01)

(58) Field of Classification Search
CPC ............. G06V 40/1318; G06V 10/145; G06V 10/147; G06V 40/13; H01L 27/14612; H01L 31/12; H01L 27/3234; H01L 27/323; H01L 27/3246; H01L 51/0097; G09G 3/3225; G09G 2360/14; G09G 3/3266; G06F 3/044; G06K 9/00013; G06K 9/0004; G09F 9/33
See application file for complete search history.

(56) References Cited

U.S. PATENT DOCUMENTS

2016/0148036 A1* 5/2016 Kim ................. G06K 9/0004
382/124
2019/0043420 A1* 2/2019 Jung ................ G09G 3/3225

FOREIGN PATENT DOCUMENTS

| JP | 2013069201 A * | 4/2013 |
| JP | 6171997 | 7/2017 |
| KR | 10-2016-0056760 | 5/2016 |
| KR | 10-2019-0015688 | 2/2019 |

* cited by examiner

*Primary Examiner* — Abhishek Sarma
(74) *Attorney, Agent, or Firm* — F. Chau & Associates, LLC

(57) ABSTRACT

A fingerprint sensor includes four transistors and a photodetector. The first transistor connects a second node with a third node based on a voltage of a first node, where the first node corresponding to a first electrode of the photodetector. The second transistor connects the second node with a read-out line based on a scan signal. The third transistor supplies a reset voltage to the first node based on a first reset signal. The fourth transistor connects the first node with the second node based on a second reset signal.

20 Claims, 16 Drawing Sheets

FIG. 4
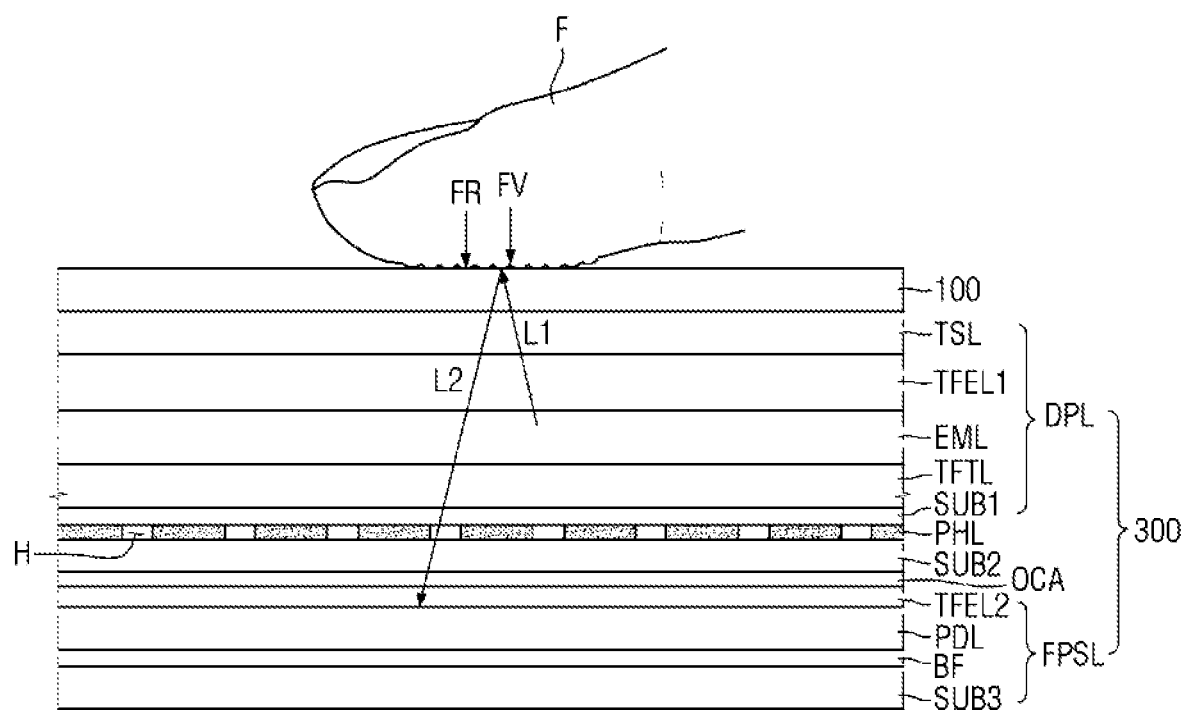
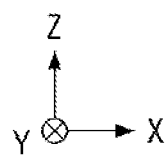

FINGERPRINT SENSOR AND DISPLAY DEVICE INCLUDING THE SAME

This application claims priority from Korean Patent Application No. 10-2020-0104575 filed on Aug. 20, 2020, in the Korean Intellectual Property Office, the disclosure of which is incorporated by reference in its entirety.

BACKGROUND

1. Field of the Disclosure

One or more embodiments herein relate to a contact sensor for a display device.

2. Description of the Related Art

The demand for display devices continues to increase, especially in electronic device such as smart phones, digital cameras, laptop computers, navigation devices, and smart televisions. These devices may include flat panel displays. Examples include liquid-crystal displays, field emission displays, and organic light-emitting displays. In addition to their functionality, display devices may have various designs to meet the requirements of an intended application. For example, some display devices may not only include a display panel for displaying images, but also an optical sensor for detecting light and a fingerprint sensor for detecting a person's fingerprint, as well as other features.

SUMMARY

In accordance with one or more embodiments, a fingerprint sensor achieves improved sensitivity by compensating for threshold voltage characteristics of a transistor. Additional embodiments may include a display device including such a fingerprint sensor. It should be noted that objects of the present disclosure are not limited to the above-mentioned object; and other objects of the present invention will be apparent to those skilled in the art from the following descriptions.

In accordance with one embodiment, a fingerprint sensor comprising a photodetector; a first transistor configured to connect a second node with a third node based on a voltage of a first node, the first node corresponding to a first electrode of the photodetector; a second transistor configured to connect the second node with a read-out line based on a scan signal; a third transistor configured to supply a reset voltage to the first node based on a first reset signal; and a fourth transistor configured to connect the first node with the second node based on a second reset signal.

In accordance with one embodiment, a display device, comprising a display layer configured to emit light to display an image; a fingerprint sensor layer on a surface of the display layer, the fingerprint sensor layer comprising a plurality of fingerprint sensors, each of the plurality of fingerprint sensors configured to receive reflected light to generate a sensing signal; and a sensor driver configured to receive the sensing signals from the plurality of fingerprint sensors through corresponding ones of a plurality of read-out lines.

Each of the plurality of fingerprint sensors comprises a photodetector; a first transistor configured to connect a second node with a third node based on a voltage of a first node that corresponds to a first electrode of the photodetector; a second transistor configured to connect the second node with a corresponding one of the plurality of the read-out lines based on a scan signal; a third transistor configured to supply a reset voltage to the first node based on a first reset signal; and a fourth transistor configured to connect the first node with the second node based on a second reset signal.

BRIEF DESCRIPTION OF THE DRAWINGS

The above and other aspects and features will become more apparent by describing in detail exemplary embodiments thereof with reference to the attached drawings, in which:

FIG. 4 illustrates a cross-sectional view of a display device according to an embodiment.

DETAILED DESCRIPTION OF THE EMBODIMENTS

Figure 1:
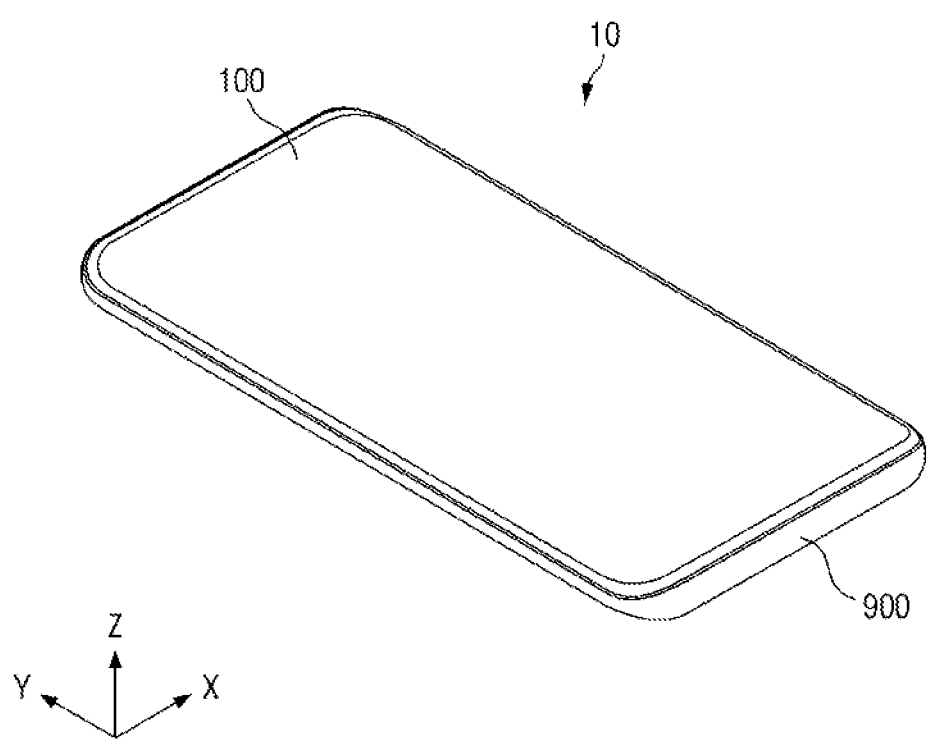
FIG. 1 illustrates an embodiment of a display device.

In the following description, for the purposes of explanation, numerous specific details are set forth to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are shown in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the X-axis, the Y-axis, and the Z-axis are not limited to three axes of a rectangular coordinate system, such as the x, y, and z axes, and may be interpreted in a broader sense. For example, the X-axis, the Y-axis, and the Z-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

As customary in the field, some embodiments are described and illustrated in the accompanying drawings in terms of functional blocks, units, and/or modules. Those skilled in the art will appreciate that these blocks, units, and/or modules are physically implemented by electronic (or optical) circuits, such as logic circuits, discrete components, microprocessors, hard-wired circuits, memory elements, wiring connections, and the like, which may be formed using semiconductor-based fabrication techniques or other manufacturing technologies. In the case of the blocks, units, and/or modules being implemented by microprocessors or other similar hardware, they may be programmed and controlled using software (e.g., microcode) to perform various functions discussed herein and may optionally be driven by firmware and/or software. It is also contemplated that each block, unit, and/or module may be implemented by dedicated hardware, or as a combination of dedicated hardware to perform some functions and a processor (e.g., one or more programmed microprocessors and associated circuitry) to perform other functions. Also, each block, unit, and/or module of some embodiments may be physically separated into two or more interacting and discrete blocks, units, and/or modules without departing from the scope of the inventive concepts. Further, the blocks, units, and/or modules of some embodiments may be physically combined into more complex blocks, units, and/or modules without departing from the scope of the inventive concepts.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Figure 2:
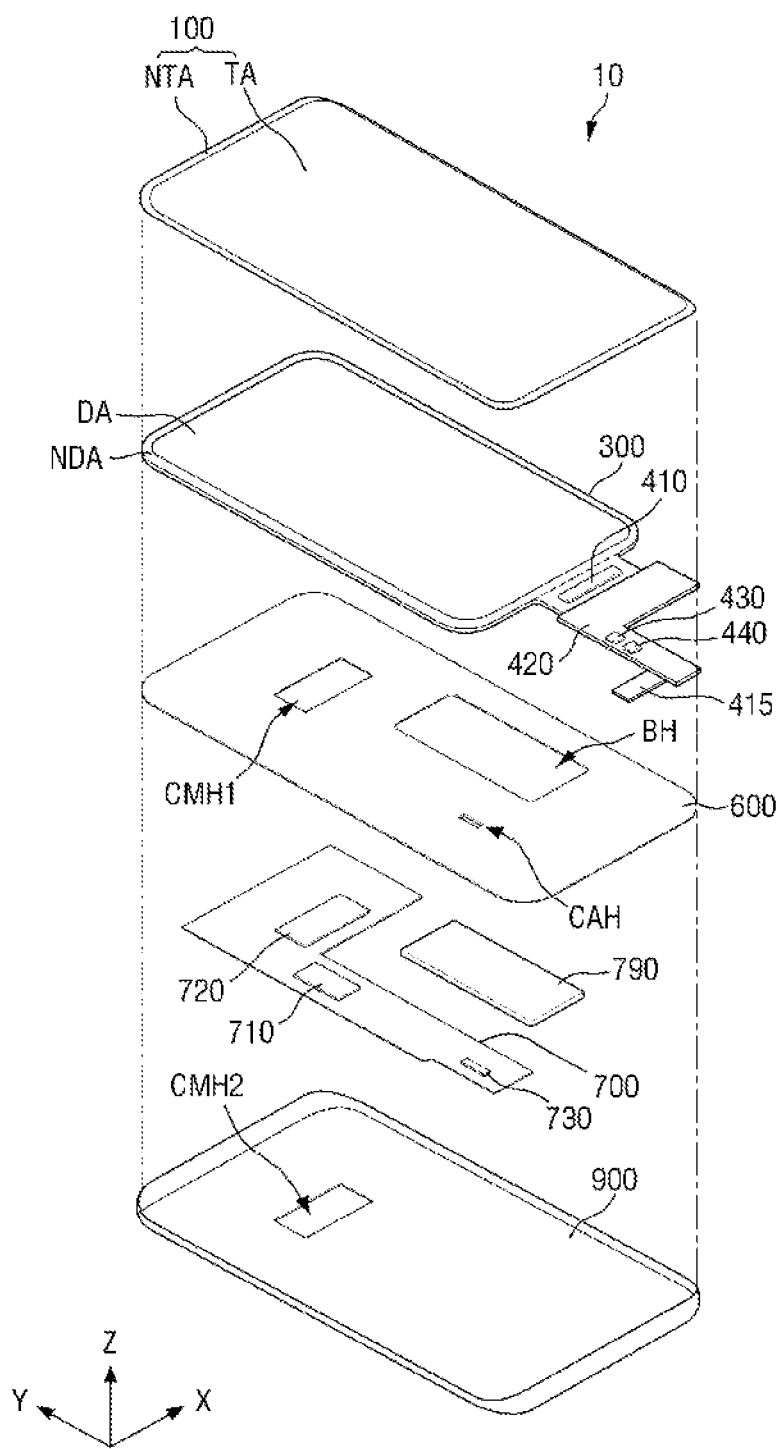
FIG. 2 illustrates an exploded view of the display device.

FIG. 1 is a perspective view of a display device 10 according to an exemplary embodiment, and FIG. 2 is an exploded, perspective view of a display device according to an exemplary embodiment.

As used herein, the terms "above," "top" and "upper surface" refer to the upper side of the display device 10 (e.g., the side indicated by the arrow in the z-axis direction). The terms "below," "bottom" and "lower surface" refer to the lower side of the display device 10 (e.g., the opposite side in the z-axis direction). Also, the terms "left," "right," "upper" and "lower" sides indicate relative positions when the display device 10 is viewed from the top. For example, the "left side" refers to the opposite side of the arrow of the x-axis direction, the "right side" refers to the side indicated by the arrow of the x-axis direction, the "upper side" refers to the side indicated by the arrow of the y-axis direction, and the "lower side" refers to the opposite side of the arrow of the y-axis direction.

Referring to FIGS. 1 and 2, the display device 10 may include a cover window 100, a display panel 300, a bracket 600, a main circuit board 700, and a bottom cover 900.

The display device 10 may display video and/or still images. The display device 10 may be used, for example, as the display screen of portable electronic devices. Examples include mobile phones, smart phones, tablet PCs, smart watches, watch phones, mobile communications terminals, electronic notebooks, electronic books, portable multimedia players (PMPs), navigation devices, and ultra mobile PCs (UMPCs), as well as televisions, laptop computers, monitors, electronic billboards, and the Internet of Things (IoT) devices, to name a few.

The display device 10 may have a rectangular shape when viewed from the top. For example, the display device 10 may have a rectangular shape having shorter sides in a first direction (x-axis direction) and longer sides in a second direction (y-axis direction) when viewed from the top, as shown in FIGS. 1 and 2. Each of the corners where the short side in the first direction (x-axis direction) meets the longer side in the second direction (y-axis direction) may be rounded with a predetermined curvature or may be a right angle. The shape of the display device 10 (when viewed from the top) is not limited to a rectangular shape, but may be formed in another shape, e.g., polygonal shape, circular shape, elliptical shape, or another shape.

The cover window 100 may be disposed on the display panel 300 to cover and protect the upper surface of the display panel 300. In one embodiment, the cover window 100 may include a transmissive area TA, corresponding to a display area DA of the display panel 300, and a non-transmissive area NTA corresponding to a non-display area NDA of the display panel 300. For example, the non-transmissive area NTA may be opaque. In another example, when the non-transmissive area does not display images, it may be formed as a decorative layer having a pattern visible to a user.

The display panel 300 may be disposed under the cover window 100. Accordingly, images displayed by the display panel 300 can be seen from the upper surface of the display device 10 through the cover window 100. The display panel 300 may be a light-emitting display panel including light-emitting elements. Examples of the display panel 300 include an organic light-emitting display panel using organic light-emitting diodes including organic emissive layer, a micro light-emitting diode display panel using micro LEDs, a quantum-dot light-emitting display panel using quantum-dot light-emitting diodes including an quantum-dot emissive layer, or an inorganic light-emitting display panel using inorganic light-emitting elements including an inorganic semiconductor. In the following description, an organic light-emitting display panel is employed as the display panel 300.

The display panel 300 may include a display area DA and a non-display area NDA.

The display area DA may overlaps with the transmissive area TA of the cover window 100 and may include a plurality of pixels for displaying images. The non-display area NDA may be disposed around the display area DA and may not display images. For example, the non-display area NDA may surround the display area DA, but the present disclosure is not limited thereto. The display area DA may occupy most of the area of the display panel 300.

Additionally, the display panel 300 may include a touch electrode layer for sensing contact from an object, such as a person's finger or a stylus pen. In one embodiment, the touch electrode layer may include a plurality of touch electrodes, which may be disposed on a display layer on which a plurality of pixels is disposed.

The display panel 300 may include a display driver 410, a circuit board 420, a sensor driver 430, and a touch driver 440. The display driver 410 may output signals and voltages for driving the display panel 300. For example, the display driver 410 may apply data voltages to data lines, may supply a driving voltage or a supply voltage to a supply voltage line, and may supply a gate control signal to a gate driver.

The circuit board 420 may be attached to pads using an anisotropic conductive film (ACF). Lead lines of the circuit board 420 may be electrically connected to the pads of the display panel 300. For example, the circuit board 420 may be a flexible printed circuit board (FPCB), a printed circuit board (PCB), or a flexible film such as a chip-on-film (COF).

The sensor driver 430 may be disposed on the circuit board 420 and electrically connected to a fingerprint sensor embedded in the display panel 300 or a separate fingerprint sensor attached to the display panel 300. The sensor driver 430 may convert voltages detected by the light-receiving elements of the display panel 300 or the photodetectors attached to the display panel 300 to sensing data (e.g., digital data) and may transmit the sensing data to a main processor 710.

The touch driver 440 may be disposed on the circuit board 420 to measure the capacitance of the touch electrodes. For example, the touch driver 440 may determine whether the existence and position of a user's touch based on a change in the capacitance of the touch electrodes. In accordance with at least one embodiment, a user's touch may refer to the case where an object (e.g., finger, stylus pen, etc.) contacts a surface of the display device 10 disposed on the touch electrode layer. The touch driver 440 can determine the position of the user's touch by distinguishing some touch electrode signals, where the user's touch is made, from the signals of other touch electrodes where the user's touch is not made.

The bracket 600 may be disposed under the display panel 300 and may include plastic, metal, or a combination thereof. The bracket 600 may include, for example, a first camera hole CMH1 into which a first camera sensor 720 is inserted, a battery hole BH in which a battery is disposed, and a cable hole CAH through which a cable 415 connected to the display driver 410 or the circuit board 420 passes.

The main circuit board 700 and the battery 790 may be disposed under the bracket 600 and may be either a printed circuit board (PCB) or a flexible printed circuit board.

The main circuit board 700 may include a main processor 710, a first camera sensor 720, and a main connector 730. The first camera sensor 720 may be disposed on both the upper and lower surfaces of the main circuit board 700, the main processor 710 may be disposed on the upper surface of the main circuit board 700, and the main connector 730 may be disposed on the lower surface of the main circuit board 700.

The main processor 710 may control all or a predetermined number of the functions of the display device 10. For example, the main processor 710 may apply digital video data to the display driver 410 so that the display panel 300 displays images. The main processor 710 may receive sensing data from the sensor driver 430 to generate a fingerprint image and may recognize the pattern of a user's fingerprint. The main processor 710 may perform authentication according to a user's fingerprint or run an application. The main processor 710 may receive touch data from the touch driver 440 to determine coordinates of the user's touch, and then may run an application indicated by an icon displayed at the coordinates of the user's touch.

The main processor 710 may convert the first image data input from the first camera sensor 720 to digital video data and then output the digital video data to the display driver 410 through the circuit board 420, so that the image captured by the first camera sensor 720 may be displayed on the display panel 300.

The first camera sensor 720 may process image frames (e.g., still image and/or video obtained by an image sensor) and output the processed image frames to the main processor 710. For example, the first camera sensor 720 may be, but is not limited to, a complementary metal oxide semiconductor (CMOS) image sensor or a charge-coupled device (CCD) sensor. The first camera sensor 720 may be exposed to the lower surface of the bottom cover 900 through the second camera hole CMH2 and may capture an object or a background under the display device 10.

Once having passed through the cable hole CAH of the bracket 600, the cable 415 may be connected to main connector 730. Accordingly, the main circuit board 700 may be electrically connected to the display driver 410 or the circuit board 420.

The battery 790 may be disposed so that it does not overlap the main circuit board 700 in the third direction (z-axis direction). The battery 790 may overlap with the battery hole BH of the bracket 600.

The main circuit board 700 may further include a mobile communications module to transmit/receive wireless signals to/from at least one of a base station, an external terminal and a server over a mobile communications network. The wireless signals may include various types of data, including but not limited to voice signals, video call signals, and a text/multimedia message transmission/receptions.

The bottom cover 900 may be disposed under the main circuit board 700 and the battery 790 and may be fastened and fixed to the bracket 600. The bottom cover 900 may form the exterior of the lower surface of the display device 10 and, for example, may be made of plastic, metal, or a combination thereof.

Additionally, the bottom cover 900 may include a second camera hole CMH2 through which the lower surface of the first camera sensor 720 is exposed. The position of the first camera sensor 720 and the positions of the first and second camera holes CMH1 and CMH2 in line with the first camera sensor 720 may different from those shown in FIG. 2.

Figure 3:
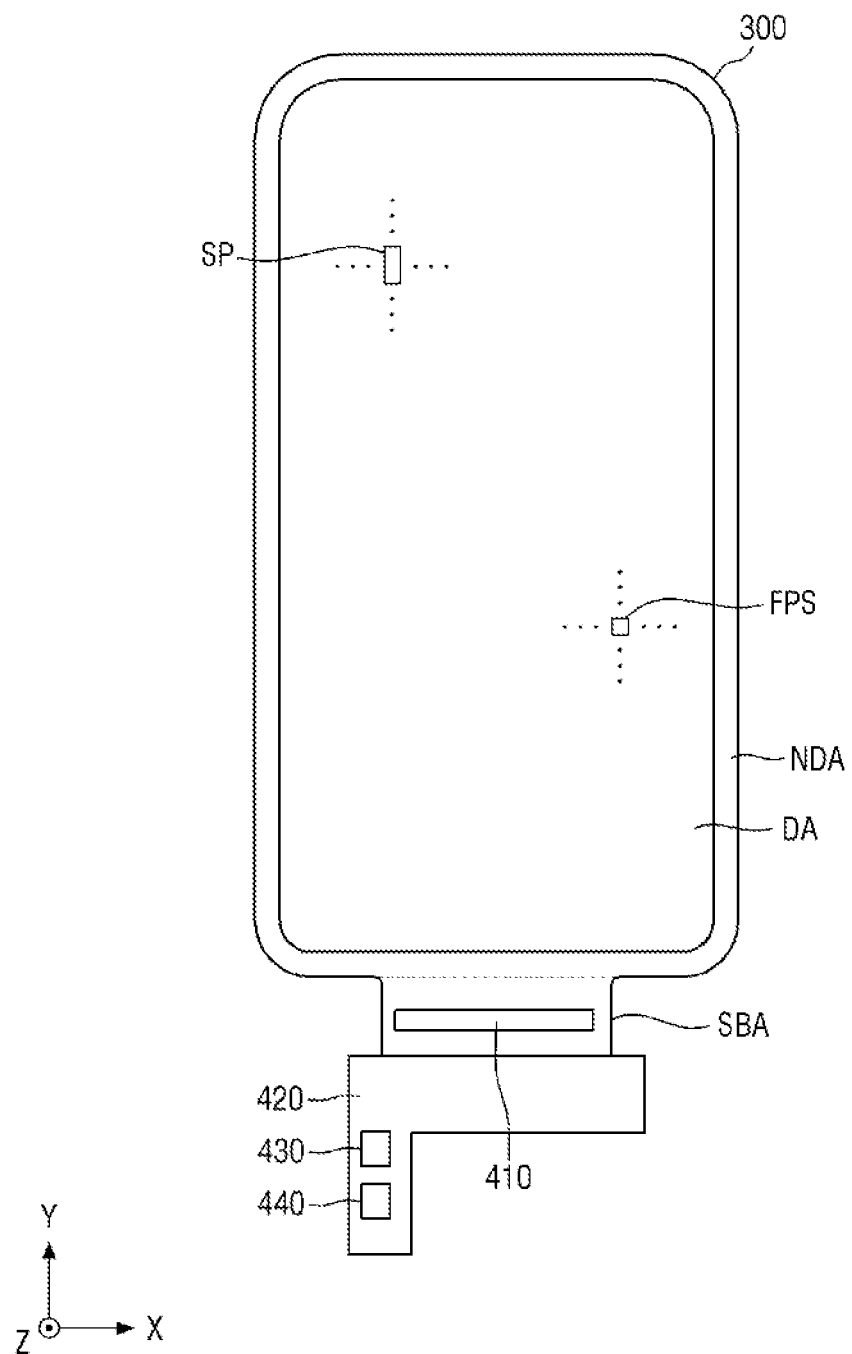
FIG. 3 illustrates an embodiment of a display panel.

FIG. 3 is a plan view of a display panel 300 of a display device according to an exemplary embodiment. Referring to FIG. 3, the display panel 300 may include the display area DA and the non-display area NDA.

The display area DA displays images and may include a plurality of pixels PX. Also, the display area DA may serve as or include a detector to detect an attribute of an external environment. For example, the display area DA may be a fingerprint recognition area for recognizing a user's fingerprint. The display layer of the display panel 300 may include a plurality of pixels SP. A fingerprint sensor layer of the display panel 300 may include a plurality of fingerprint sensors FPS. A plurality of pixels SP and a plurality of fingerprint sensors FPS may overlap each other in the third direction (z-axis direction) in the display area DA.

Accordingly, the display area DA may be used as an area for recognizing a user's fingerprint, as well as the area for displaying images. For example, the display layer of the display panel 300 in which the plurality of pixels SP is arranged and the fingerprint sensor layer of the display panel 300 in which the plurality of fingerprint sensors FPS is arranged may overlap each other in the third direction (z-axis direction).

The non-display area NDA may correspond to all or a portion of the remaining area of the display panel 300, except the display area DA. The non-display area NDA may include, for example, a gate driver for applying gate signals to gate lines, fan-out lines connecting data lines with the display driver, and pads connected to the circuit board. For example, the non-display area NDA may be formed to be opaque and, in some embodiments, may be formed as a decoration layer including a pattern visible to a user.

The display panel 300 may further include a sub-area SBA protruding from one side of the non-display area NDA. The sub-area SBA may protrude from one side of the non-display area NDA in the opposite direction of the second direction (y-axis direction). For example, the length of the sub-area SBA in the first direction (x-axis direction) may be less than the length of the display area DA in the first direction (x-axis direction). The length of the sub-area SBA in the second direction (y-axis direction) may be less than the length of the display area DA in the second direction (y-axis direction). It is, however, to be understood that the present disclosure is not limited thereto. For example, the sub-area SBA may be bent and may be disposed under the display panel 300. In such case, the sub-area SBA may overlap the display area DA in the third direction (z-axis direction).

The display driver 410 and the circuit board 420 may be disposed in the sub-area SBA of the display panel 300. The circuit board 420 may be attached on the pads of the sub-area SBA of the display panel 300, for example, using a low-resistance, high-reliability material (e.g., anisotropic conductive film (SAP) and self assembly anisotropic conductive paste (SAP)).

FIG. 4 is a cross-sectional view of a display device according to an exemplary embodiment. Referring to FIG. 4, the display panel 300 may include a first substrate SUB1, an optical layer PHL, a display layer DPL, and a fingerprint sensor layer FPSL.

The first substrate SUB1 may be a base substrate or a base member of the display layer DPL and may be made of an insulating material such as a polymer resin. For example, the first substrate SUB1 may be made of polyethersulphone (PES), polyacrylate (PAC), polyacrylate (PAR), polyetherimide (PEI), polyethylene naphthalate (PEN), polyethylene terephthalate (PET), polyphenylene sulfide (PPS), polyallylate (PAR), polyimide (PI), polycarbonate (PC), cellulose triacetate (CTA), cellulose acetate propionate (CAP) or a combination thereof.

In one embodiment, the first substrate SUB1 may be a rigid substrate or a flexible substrate. In this latter case, the first substrate SUB1 may be bent, folded, or rolled. Also, when the first substrate SUB1 is a flexible substrate, it may be made of polyimide (PI) or another material that allows for being, folding, or rolling.

In one embodiment, the first substrate SUB1 may be omitted. In this case, the upper surface of the fingerprint sensor layer FPSL may, for example, be attached directly to the lower surface of the optical layer PHL by an adhesive member OCA. The optical layer PHL may be disposed on the lower surface of the display layer DPI. In one embodiment, the optical layer PHL may be disposed between the first substrate SUB1 and the thin-film transistor layer TFTL to block light incident on the thin-film transistor layer TFTL and an emission material layer EML. The optical layer PHL may be made be constructed as a single layer or multiple layers of one or more of molybdenum (Mo), aluminum (Al), chromium (Cr), gold (Au), titanium (Ti), nickel (Ni), neodymium (Nd) and copper (Cu) or an alloy thereof. For another example, the optical layer PHL may be implemented as a black matrix or may be formed of various materials that can block light.

The optical layer PHL may include a plurality of holes H, which may serve as optical paths through which light travels toward the fingerprint sensor layer FPSL (second light L2), after light emitted from the emission material layer EML (first light L1) is reflected by the user's body. In one embodiment, each of the plurality of holes H may be a space surrounded by the first substrate SUB1, the inner walls of the respective hole H of the optical layer PHL, and the second substrate SUB2. In one embodiment, the plurality of holes H may be filled with the material of the second substrate SUB2 during the process of forming the second substrate SUB2 on the optical layer PHL. Also, the plurality of holes H may be optical paths through which the second light L2 travels toward the fingerprint sensor layer FPSL after the first light L1 emitted from the emission material layer EML is reflected by the user's body.

The plurality of holes H may not overlap the plurality of thin-film transistors of the thin-film transistor layer TFTL, while the optical layer PHL may overlap the plurality of thin-film transistors of the thin-film transistor layer TFTL. For example, the plurality of holes H may be arranged along the first direction (x-axis direction) and the second direction (y-axis direction). The size of each of the plurality of holes H may be determined depending on the path of the second light L2.

The display layer DPL may include the second substrate SUB2, the thin-film transistor layer TFTL, the emission material layer EML, a first thin-film encapsulation layer TFEL1, and the touch sensor layer TSL. The second substrate SUB2 may be disposed on the optical layer PHL to support the thin-film transistor layer TFTL. The second substrate SUB2 may be made, for example, of an insulating material such as a polymer resin. Also, the second substrate SUB2 may be a rigid substrate or a flexible substrate that may be bent, folded, or rolled. When the second substrate SUB2 is a flexible substrate, it may be made of polyimide (PI) or another material that allows for being, folding, or rolling.

For another example, the second substrate SUB2 may be eliminated, and the thin-film transistor layer TFTL may be disposed directly on the optical layer PHL.

The thin-film transistor layer TFTL may be disposed above the second substrate SUB2 and may include at least one thin-film transistor for driving each of the plurality of pixels SP. In one embodiment, the at least one thin-film transistor of the pixel SP may include a semiconductor layer, a gate electrode, a drain electrode, and a source electrode. For example, the thin-film transistor layer TFTL may further include gate lines, data lines, power lines, gate control lines connected to the at least one pixel SPACE, and routing lines connecting pads with data lines.

The emission material layer EML may be disposed on the thin-film transistor layer TFTL and may include a light-emitting element connected to the at least one thin-film transistor of the thin-film transistor layer TFTL. The light-emitting element may include a first electrode, an emissive layer, and a second electrode. For example, the emissive layer may be, but is not limited to, an organic emissive layer made of an organic material. When the emissive layer is an organic emissive layer, the thin-film transistor of the thin-film transistor layer TFTL may apply a predetermined voltage to the first electrode of the light-emitting element. The second electrode of the light-emitting element may receive a common voltage or cathode voltage. As a result, holes and electrons may move to the organic emissive layer through a hole transporting layer and a electron transporting layer, respectively, and may then combine in the organic emissive layer to generation emission of light.

The emission material layer EML may include a pixel-defining layer defining a plurality of pixels SP. The first electrode and the emissive layer of the light-emitting element may be spaced apart and insulated from each other by the pixel-defining layer.

The first thin-film encapsulation layer TFEL1 may be disposed on the emission material layer EML to cover the thin-film transistor layer TFTL and the emission material layer EML. The first thin-film encapsulation layer TFEL1 can prevent oxygen or moisture from permeating into the emission material layer EML. For example, the first thin-film encapsulation layer TFEL1 may include at least one inorganic layer. The first thin film encapsulation layer TFEL1 may include, but is not limited to, an inorganic film such as a silicon nitride layer, a silicon oxynitride layer, a silicon oxide layer, a titanium oxide layer, or an aluminum oxide layer.

The first thin-film encapsulation layer TFEL1 can protect the emission material layer EML from particles such as dust. The first thin-film encapsulation layer TFEL1 may include, for example, at least one organic film. The first thin-film encapsulation layer TFEL1 may include, but is not limited to, an organic layer such as an acrylic resin, an epoxy resin, a phenol resin, a polyamide resin or a polyimide resin.

The touch sensor layer TSL may be disposed on the first thin-film encapsulation layer TFEL1. If the touch sensor layer TSL is disposed directly on the first thin-film encapsulation layer TFLE1, the thickness of the display device 10 can be reduced, compared with a display device in which a separate touch panel including the touch sensor layer TSL is attached on the first thin-film encapsulation layer TFEL1.

The touch sensor layer TSL may include touch electrodes for sensing a user's touch, and touch electrode lines connected to pads with the touch electrodes. The touch electrodes of the touch sensor layer TSL may be disposed in a touch sensing area overlapping the display area DA of the display panel 300.

The cover window 100 may be disposed at the top of the display panel 300. In one embodiment, the cover window 100 may be disposed on the touch sensor layer TSL of the display panel 300. For example, the cover window 100 may be attached on the touch sensor layer TSL by an optically clear adhesive. The cover window 100 may be in direct contact with a user's finger F or other object.

The fingerprint sensor layer FPSL may be disposed at the bottom of the display panel 300. For example, the fingerprint sensor layer FPSL may be attached under the first substrate SUB1 through an adhesive member (OCA). The adhesive member may be, for example, but is not limited to, an optical clear adhesive (OCA). The upper surface of the first substrate SUB1 may face the display panel 300 or the optical layer PHL, and the lower surface of the first substrate SUB1 may face the fingerprint sensor layer FPSL.

The fingerprint sensor layer FPSL may include a plurality of fingerprint sensors FPS, for example, as shown in FIG. 3. The plurality of fingerprint sensors FPS may be connected to the sensor driver 430. The fingerprint sensors FPS may be optical fingerprint sensors. For example, the fingerprint sensors FPS may be implemented as, but are not limited to, photo diodes, CMOS image sensors, CCD cameras, photo transistors, etc. The plurality of fingerprint sensors FPS may recognize a fingerprint of a finger F by sensing light reflected at the ridges FR and valleys FV between the ridges FR of the finger F.

For example, when the user's finger F is brought into contact with the cover window 100, the first light L1 output from the emission material layer EML may be reflected by the ridges FR and/or valleys FV of the finger F, and the reflected second light L2 may pass through the holes H of the optical layer PHL to reach the fingerprint sensor layer FPSL disposed under the first substrate SUB1. The sensor driver 430 can distinguish the second light L2 reflected at the ridges FR of the finger F from the second light L2 reflected at the valleys FV of the finger F as received by the fingerprint sensors FPS, to generate sensing data. Then, the sensor driver 430 may transmit the sensing data to the main processor 710, which may generate a fingerprint image based on the sensing data to recognize the pattern of the user's fingerprint. Accordingly, the plurality of holes H of the optical layer PHL may work as paths for the second light L2 reflected by the user's finger F.

By disposing the fingerprint sensor layer FPSL at the bottom of the display panel 300, it is possible to simplify a process of fabricating the display device 10, and to prevent a decrease in resolution, because the fingerprint sensors FPS are not disposed in the paths through which the first light L1 exits, e.g., the upper side of the emission material layer EML.

The fingerprint sensor layer FPSL may include a third substrate SUB3, a buffer layer BF, a photodetector layer PDL, and a second thin-film encapsulation layer TFEL2. The third substrate SUB3 may be a base substrate or a base member of the fingerprint sensor layer FPSL and may be made of an insulating material such as a polymer resin. The third substrate SUB3 may be a rigid substrate or a flexible substrate that may be bent, folded, or rolled. When the third substrate SUB3 is a flexible substrate, it may be made of, for example, polyimide (PI) or another material allowing for bending, folding, or rolling.

The buffer layer BF may be disposed on the third substrate SUB3 and may be formed of an inorganic film that can prevent or reduce permeation of air or moisture. For example, the buffer layer BF may include a plurality of inorganic films stacked on one another alternately. The buffer layer BF may be made include, but is not limited to, multiple layers in which one or more inorganic layers (e.g., of a silicon nitride layer, a silicon oxynitride layer, a silicon oxide layer, a titanium oxide layer and/or an aluminum oxide layer) are alternately stacked on one another.

The photodetector layer PDL may be disposed on the buffer layer BF and may include at least one thin-film transistor for driving each of the plurality of fingerprint sensors FPS, and a photodetector connected to the at least one thin-film transistor. The at least one thin-film transistor of the fingerprint sensor FPS may include a semiconductor layer, a gate electrode, a source electrode, and a drain electrode. For example, the photodetector layer PDL may further include scan lines, read-out lines and voltage lines connected to at least one thin-film transistor of the fingerprint sensor FPS.

The photodetector may include a first electrode, a photosensitive layer, and a second electrode. The photosensitive layer may include, for example, but is not limited to, amorphous silicon (a-Si). The photosensitive layer may receive the second light L2 and convert the energy of the second light L2 to an electrical signal (e.g., current or voltage) generated between the first electrode and the second electrode.

The second thin-film encapsulation layer TFEL2 may be disposed on and cover the upper surface of the photodetector layer PDL and may prevent or reduce oxygen or moisture from permeating into the photodetector layer PDL. For example, the second thin-film encapsulation layer TFEL2 may include at least one inorganic film. The second thin-film encapsulation layer TFEL2 may include, but is not limited to, an inorganic film such as a silicon nitride layer, a silicon oxynitride layer, a silicon oxide layer, a titanium oxide layer, or an aluminum oxide layer.

The second thin-film encapsulation layer TFEL2 can protect the photodetector layer PDL from particles such as dust. For example, the second thin-film encapsulation layer TFEL2 may include at least one organic film. The second thin-film encapsulation layer TFEL2 may include, but is not limited to, an organic layer such as an acrylic resin, an epoxy resin, a phenol resin, a polyamide resin and a polyimide resin.

In one embodiment, the fingerprint sensor layer FPSL may further include an encapsulation substrate disposed on the second thin-film encapsulation layer TFEL2. The encapsulation substrate may cover the second thin-film encapsulation layer TFEL2 to prevent or reduce air or moisture from permeating into the fingerprint sensor layer FPSL. The encapsulation substrate may be, for example, a light-transmitting substrate and may be a glass substrate. The encapsulation substrate may be disposed on the lower surface of the first substrate SUB1 by, but is not limited to, an adhesive member OCA.

Figure 5:
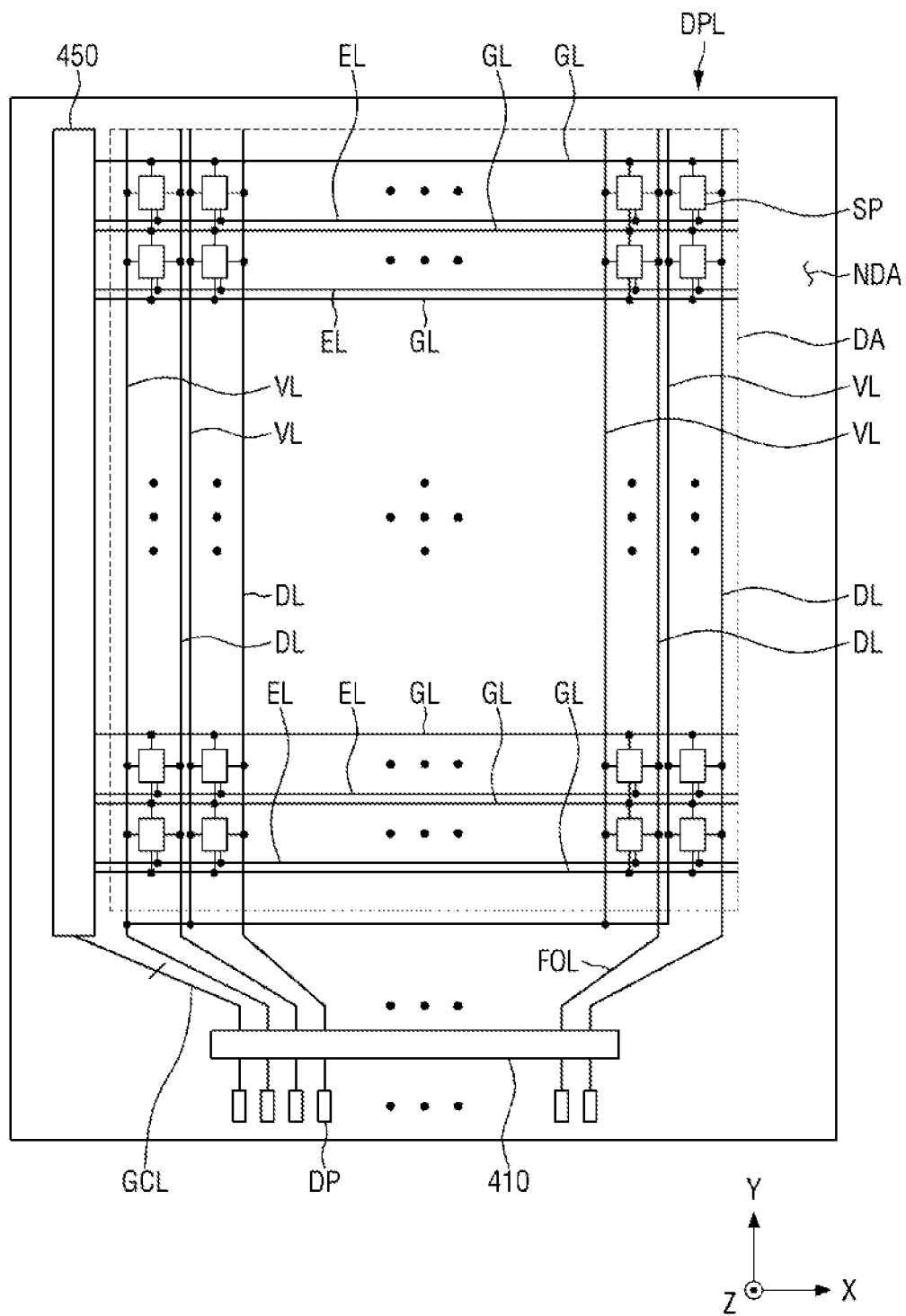
FIG. 5 illustrates an embodiment of a connection relationship between pixels and lines of a display device.

FIG. 5 is a view showing an embodiment of connection relationship between pixels and lines of a display device.

Referring to FIG. 5, a display panel 300 may include a display area DA and a non-display area NDA. The display area DA may include a plurality of pixels SP, voltage lines VL connected to the pixels SP, gate lines GL, emission lines EL, and data lines DL. Each of the pixels SP may be connected to at least one gate line GL, at least one data line DL, at least one emission line EL, and at least one voltage line VL. For example, each of the pixels SP may be connected to two gate lines GL, one data line DL, one emission line EL, and one voltage line VL. In one embodiment, each of the pixels SP may be connected to three or more gate lines GL or a different number of arrangement of the gate lines GL, data lines DL, emission lines EL, and/or voltage lines VL.

In one embodiment, each of the pixels SP may include a driving transistor, at least one switching transistor, a light-emitting element, and a capacitor. When a data voltage is applied to the gate electrode, the driving transistor may supply a corresponding driving current to the light-emitting element so that light is emitted. For example, the driving transistor and at least one switching transistor may be thin-film transistors. The light-emitting element may emit light having a certain luminance in proportional to the magnitude of the driving current of the driving transistor. The light-emitting element may be, for example, an organic light-emitting diode including a first electrode, an organic emissive layer, and a second electrode. The capacitor can keep the data voltage applied to the gate electrode of the driving transistor constant.

The pixels SP may receive driving voltage through voltage supply lines VL. The driving voltage may be, for example, a high-level voltage for driving the light-emitting elements of the pixels SP. The plurality of voltage lines VL may be spaced apart from each other in the first direction DR1 and may be extended in the second direction DR2. For example, the plurality of voltage lines VL may be disposed along columns of pixels SP disposed in the display area DA, respectively. Each of the voltage lines VL may be connected to the pixels SP arranged in the same column and may supply driving voltage to the pixels SP.

The gate lines GL and emission lines EL may be extended in the first direction (x-axis direction) and may be spaced apart from one another in the second direction (y-axis direction) intersecting the first direction (x-axis direction). The gate lines GL and the emission lines EL may be formed parallel to each other.

The data lines VL may be spaced apart from each other in the first direction DR1 and may be extended in the second direction DR2. The data lines DL may be formed parallel to the voltage lines VL.

The non-display area NDA may correspond to all or a portion of the remaining area of the display panel 300, except the display area DA. The non-display area NDA may include a gate driver 450 for applying gate signals to the gate lines GL, fan-out lines FL connecting the data lines DL with the display driver 410, and pads DP connected to the circuit board 420. The pads DP may be closer to one edge of the display panel 300 than the display driver 410.

The display driver 410 may be connected to the pads DP and may receive digital video data and timing signals. The display driver 410 may convert the digital video data to analog data voltages and may supply the analog data voltages to the data lines DL through the fan-out lines FOL. For example, the display driver 410 may be implemented as an integrated circuit (IC) and may be attached on the first substrate SUB1 by a chip-on-glass (COG) technique, a chip-on-plastic (COP) technique, or ultrasonic bonding. However, it is to be understood that the present disclosure is not limited thereto. The display driver 410 may generate a gate control signal and supply the gate control signal to the gate driver 450 through gate control lines GCL.

The gate driver 450 may be disposed on one side of the non-display area NDA and may include a plurality of thin-film transistors for generating gate signals based on the gate control signal. The gate driver 450 may supply gate signals to the pixels SP through the gate lines GL and may select pixels SP to which data voltages are to be applied.

Figure 6:
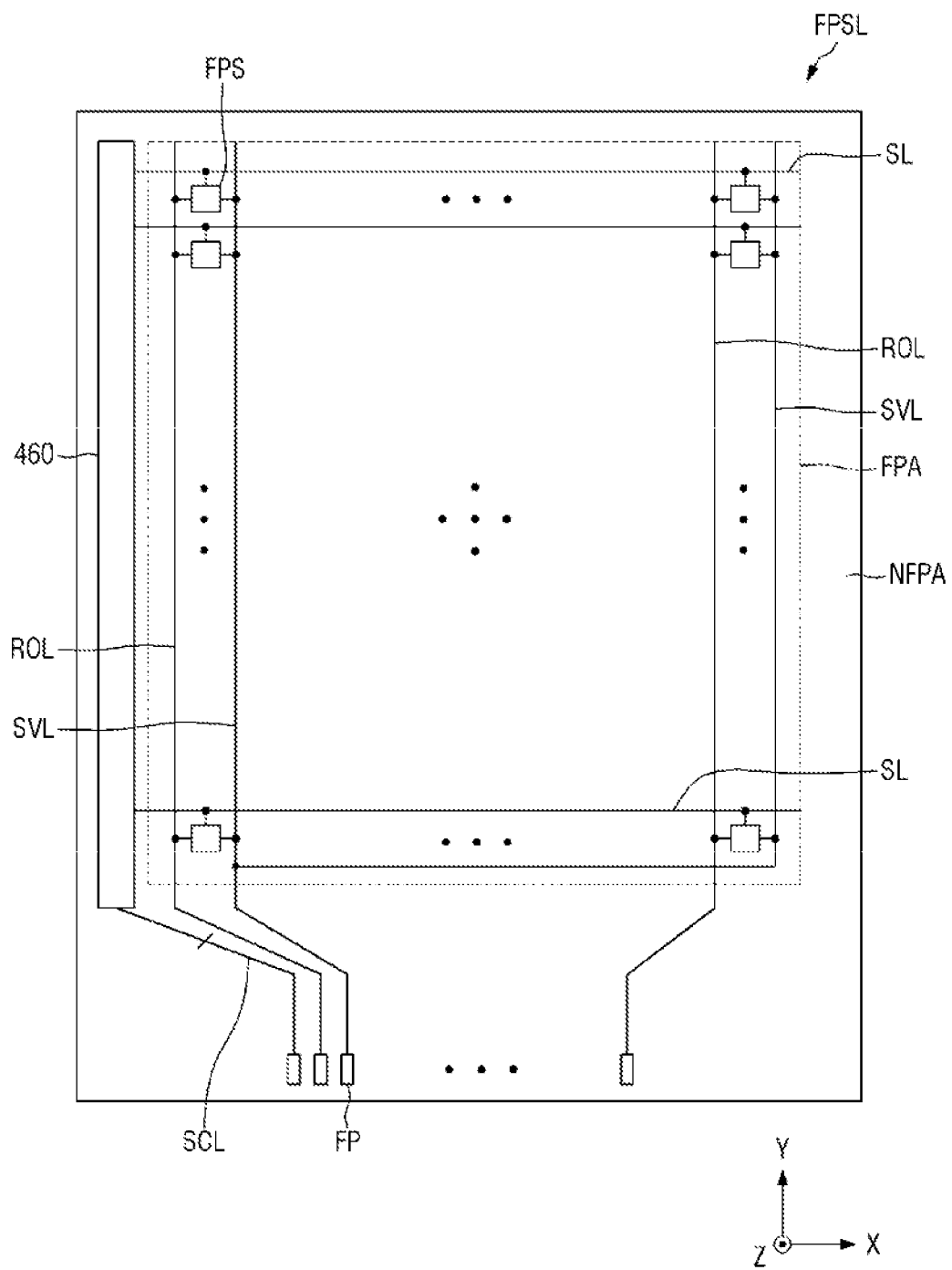
FIG. 6 illustrates an embodiment of a connection relationship between fingerprint sensors and lines of a display device.

FIG. 6 is a view showing an embodiment of a connection relationship between fingerprint sensors and lines of a display device.

Referring to FIG. 6, the fingerprint sensor layer FPSL may include a fingerprint recognition area FPA and a non-fingerprint recognition area NFPA. The fingerprint recognition area FPA may include a plurality of fingerprint sensors FPS, a plurality of scan lines SL connected to the fingerprint sensors FPS, a plurality of read-out lines ROL, and a plurality of supply voltage lines SVL. The plurality of fingerprint sensors FPS may be spaced apart from one another by a distance ranging, for example, from 5 to 50 μm. In one embodiment, each fingerprint pixel on the cover window 100 may include 20 to 30 fingerprint sensors FPS of the fingerprint sensor layer FPSL. The number of fingerprint sensors FPS per fingerprint pixel may be different in another embodiment.

The plurality of fingerprint sensors FPS may be connected to the scan driver 460 through the scan lines SL and may receive a scan signal from the scan driver 460. The scan lines SL may extend in the first direction (x-axis direction) and may be spaced apart from each other in the second direction (y-axis direction). The scan driver 460 may supply a scan signal to each of the plurality of fingerprint sensors FPS to select fingerprint sensors FPS and to sense a change in the sensing signal.

The fingerprint sensors FPS may be connected to the fingerprint pads FP through the read-out lines ROL. The fingerprint pads FP may be connected to the sensor driver 430. The fingerprint sensors FPS may supply sensing signals to the sensor driver 430 through the read-out lines ROL. The read-out lines ROL may be spaced apart from each other in the first direction (x-axis direction) and may be extended in the second direction (y-axis direction).

The non-fingerprint recognition area NFPA may be disposed on the outer side of the fingerprint recognition area FPA. The non-fingerprint recognition area NFPA may be defined as an area of the fingerprint sensor layer FPSL different from the fingerprint recognition area FPA. For example, the scan driver 460 may be disposed on one side of the non-fingerprint recognition area NFPA and may be connected to the scan lines SL extended to the fingerprint recognition area FPA.

When a user's finger F is brought into contact with the cover window 100, the fingerprint sensor FPS that has received the scan signal may output a changed sensing signal. The sensing signal of the fingerprint sensor FPS that has received light reflected by the ridges FR of the finger F may be different from the sensing signal of the fingerprint sensor FPS that has received the light reflected by valleys FV of the finger F. The sensor driver 430 may generate sensing data by identifying or otherwise based on such a difference between the sensing signals. The main processor 710 may determine whether the ridges FR or valleys FV of the finger F are brought into contact with the fingerprint pixel, of the cover window 100 corresponding to the fingerprint sensor FPS, based on the sensing data. Accordingly, the main processor 710 can recognize the pattern of a user's fingerprint based on the sensing data.

The non-fingerprint recognition area NFPA may further include fingerprint recognition pads FP at one edge of the fingerprint sensor layer FPSL. The fingerprint recognition pads FP may be connected to the sensor driver 430 to supply a signal applied from an external integrated circuit to the sensor driver 430. In one embodiment, the display layer DPL and the fingerprint sensor layer FPSL may have the same size when viewed from the top, but these sizes may be different in another embodiment. In one embodiment, the size of the fingerprint sensor layer FPSL may be equal to the size of part of the display layer DPL.

Figure 7:
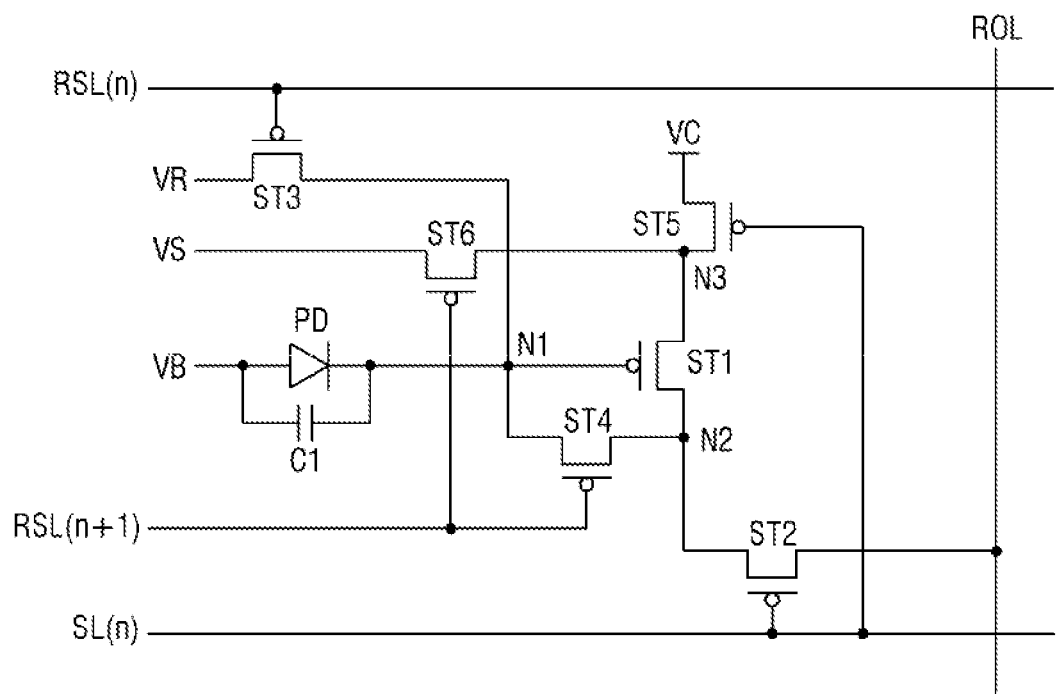
FIG. 7 illustrates an embodiment of a fingerprint sensor of a display device.

FIG. 7 is a circuit diagram of a fingerprint sensor FPS of a display device according to an exemplary embodiment.

Referring to FIG. 7, the fingerprint sensor FPS may include first to sixth transistors ST1 to ST6, a photodetector PD, and a capacitor C1. The first transistor ST1 may include a gate electrode connected to a first node N1, a source electrode connected to a third node N3, and a drain electrode connected to a second node N2. The first transistor ST1 may control a source-drain current Isd (hereinafter referred to as a sensing current) based on the voltage of the first node N1 that is the first electrode of the photodetector PD. The sensing current Isd flowing through the channel of the first transistor ST1 may be proportional to the square of the difference between the threshold voltage Vth and the voltage Vsg between the source electrode and the gate electrode of the first transistor ST1 (Isd=k'×(Vsg−Vth)$^2$), where k' denotes a proportional coefficient determined by the structure and physical properties of the first transistor ST1, Vsg denotes the source-gate voltage of the first transistor ST1, and Vth denotes the threshold voltage of the first transistor ST1.

The second transistor ST2 may be turned on by a scan signal of the scan line SL(n), to connect the second node N2 (corresponding to the drain electrode of the first transistor ST1) with the read-out line ROL. The gate electrode of the second transistor ST2 may be connected to the scan line SL(n), the source electrode may be connected to the second node N2, and the drain electrode may be connected to the read-out line ROL. The source electrode of the second transistor ST2 may be connected to the drain electrode of the first transistor ST1 and the source electrode of the fourth transistor ST4 through second node N2.

The third transistor ST3 may be turned on by a first reset signal of a first reset line RSL(n), to supply a reset voltage VR to the first node N1. The third transistor ST3 may have a gate electrode connected to the first reset line RSL(n), a source electrode connected to a reset voltage line, and a drain electrode connected to the first node N1. Additionally, the drain electrode of the third transistor ST3 may be connected to the first electrode of the photodetector PD, the gate electrode of the first transistor ST1, and the drain electrode of the fourth transistor ST4 through the first node N1.

The fourth transistor ST4 may be turned on by a second reset signal of a second reset line RSL(n+1), to connect the first node N1 with the second node N2. The fourth transistor ST4 may have a gate electrode connected to the second reset line RSL(n+1), a source electrode connected to the second node N2, and a drain electrode connected to the first node N1. Additionally, the source electrode of the fourth transistor ST4 may be connected to the drain electrode of the first transistor ST1 and the source electrode of the second transistor ST2 through the second node N2. Also, the drain electrode of the fourth transistor ST4 may be connected to the first electrode of the photodetector PD, the gate electrode of the first transistor ST1, and the drain electrode of the third transistor ST3 through the first node N1.

The fifth transistor ST5 may be turned on by the scan signal of the scan line SL(n), to apply a common voltage VC to the third node N3 that corresponds to the source electrode of the first transistor ST1. For example, the common voltage VC may be, for example, a high-level voltage. The fifth transistor ST5 may have a gate electrode connected to the scan line SL(n), a source electrode connected to a common voltage line, and a drain electrode connected to the third node N3. Additionally, the drain electrode of the fifth transistor ST5 may be connected to the source electrode of the first transistor ST1 and the drain electrode of the sixth transistor ST6 through the third node N3.

The sixth transistor ST6 may be turned on by the second reset signal of the second reset line RSL(n+1), to apply a sampling voltage VS to the third node N3 that corresponds to the source electrode of the first transistor ST1. The sixth transistor ST6 may have a gate electrode connected to the second reset line RSL(n+1), a source electrode connected to a sampling voltage line, and a drain electrode connected to the third node N3. Additionally, the drain electrode of the sixth transistor ST6 may be connected to the source electrode of the first transistor ST1 and the drain electrode of the fifth transistor ST5 through the third node N3.

The photodetector PD may recognize the pattern of a user's fingerprint based on the second light L2 reflected by a user's finger F. The photodetector PD may have a first electrode connected to the first node N1 that corresponds to the gate electrode of the first transistor ST1 and the second electrode connected to a bias voltage line. The second electrode of the photodetector PD may receive a bias voltage VB from the bias voltage line. The bias voltage VB may be, for example, a low-level voltage. The first capacitor C1 may be disposed between the first electrode and the second electrode of the photodetector PD, to prevent excessive current from flowing in the photodetector PD.

The photodetector PD may not receive light, for example, if an object (e.g., user's finger) does not physically contact the cover window 100. The fingerprint sensor FPS may apply a reverse bias between the first electrode and the second electrode of the photodetector PD. In one embodiment, reverse bias may refer to the case where the voltage of the first node N1 (which corresponds to the first electrode of a photodetector PD) is greater than the bias voltage VB applied to the second electrode of the photodetector PD. If the photodetector PD receives no light, the photodetector PD may have a voltage in the reverse direction between the first electrode and the second electrode, and the photodetector PD may cut off a current between the first node N1 and the bias voltage line.

When a user's finger F is brought into contact with the cover window 100, the photodetector PD may receive the second light L2 reflected by the ridges FR and/or the valleys FV of the finger F. The first light L1 output from the emission material layer EML is reflected by the ridges FR and/or the valleys FV of the finger F, and the reflected second light L2 may reach the photodetector PD of the fingerprint sensor layer FPSL. The photodetector PD may convert the energy of the second light L2 to an electrical signal (e.g., current or voltage) formed between the first electrode and the second electrode. The converted electrical signal may then flow from the first node N1 to the bias voltage line.

For example, when a reverse bias is applied between the first electrode and the second electrode of the photodetector PD, a current in the reverse direction, proportional to the amount of the second light L2, may flow in the photodetector PD. Thus, the voltage of the first node N1 may be decreased. Accordingly, when the photodetector PD receives the second light L2, the voltage of the first node N1 may be reduced and the magnitude of the sensing current (or the source-drain current) of the first transistor ST1 may be reduced. The sensing current of the first transistor ST1 may pass through the second transistor ST2 and may be applied to the sensor driver 430 as a sensing signal.

The sensor driver 430 may generate sensing data based on the sensing signal received from the fingerprint sensors FPS. The main processor 710 may determine whether the sensing data corresponds to the ridges FR and/or the valleys FV of the finger F, thereby recognizing the pattern of a user's fingerprint.

The photodetector PD may be implemented as, for example, a photo transistor or a photo diode. The photodetector PD may be an optical sensor that converts light energy to electrical energy and may utilize a photovoltaic effect (e.g., a change of current flowing therein) depending on the intensity of light.

Figure 8:
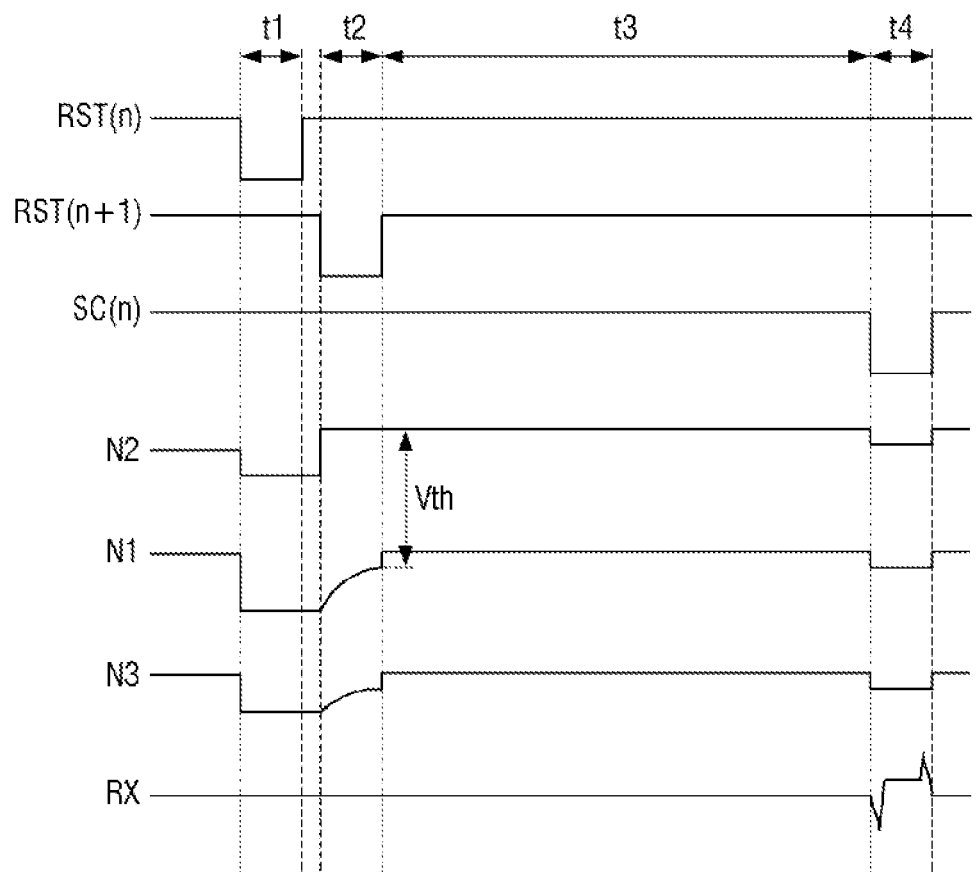
FIG. 8 illustrates an embodiment of signals for the fingerprint sensor.
Figure 9:
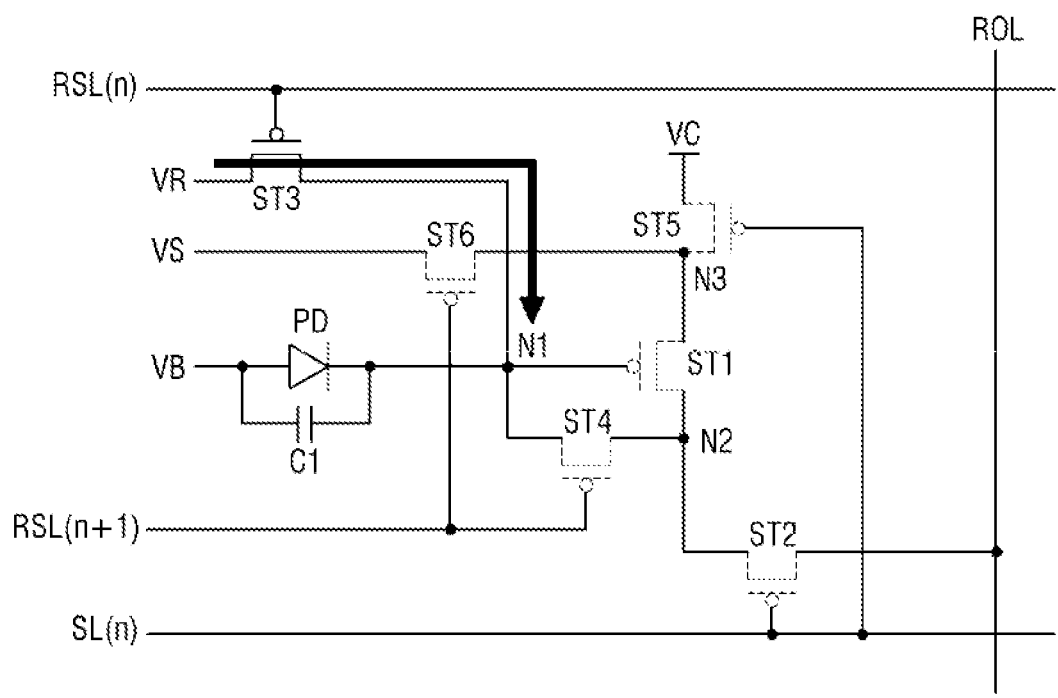
FIG. 9 illustrates an embodiment of operation of a fingerprint sensor during a first period.
Figure 10:
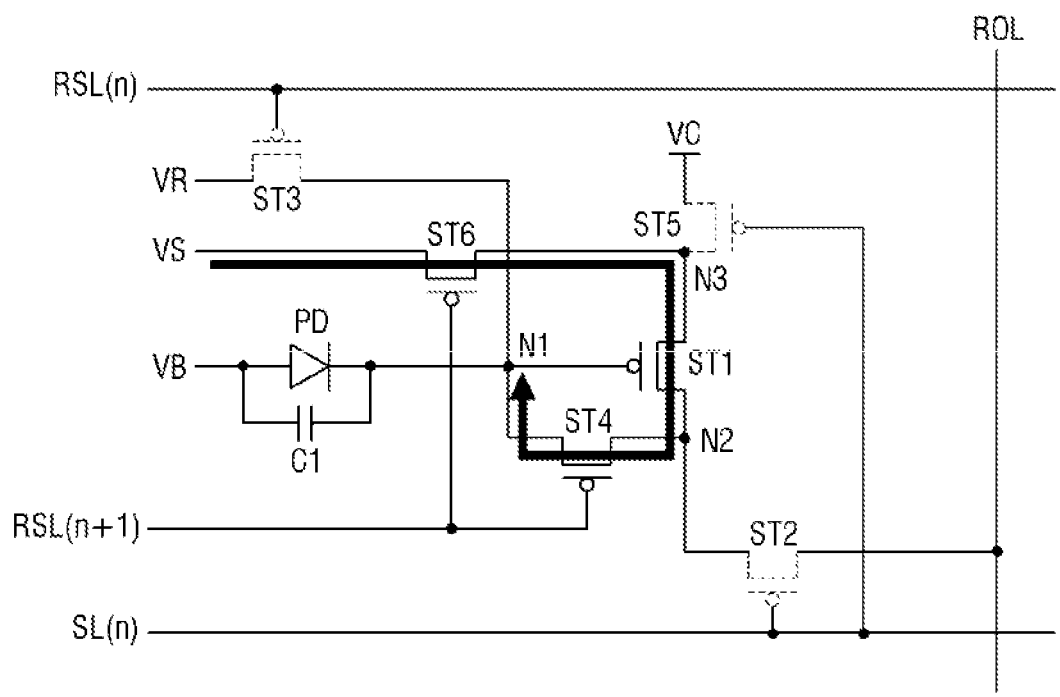
FIG. 10 illustrates an embodiment of the operation of the fingerprint sensor during a second period.
Figure 11:
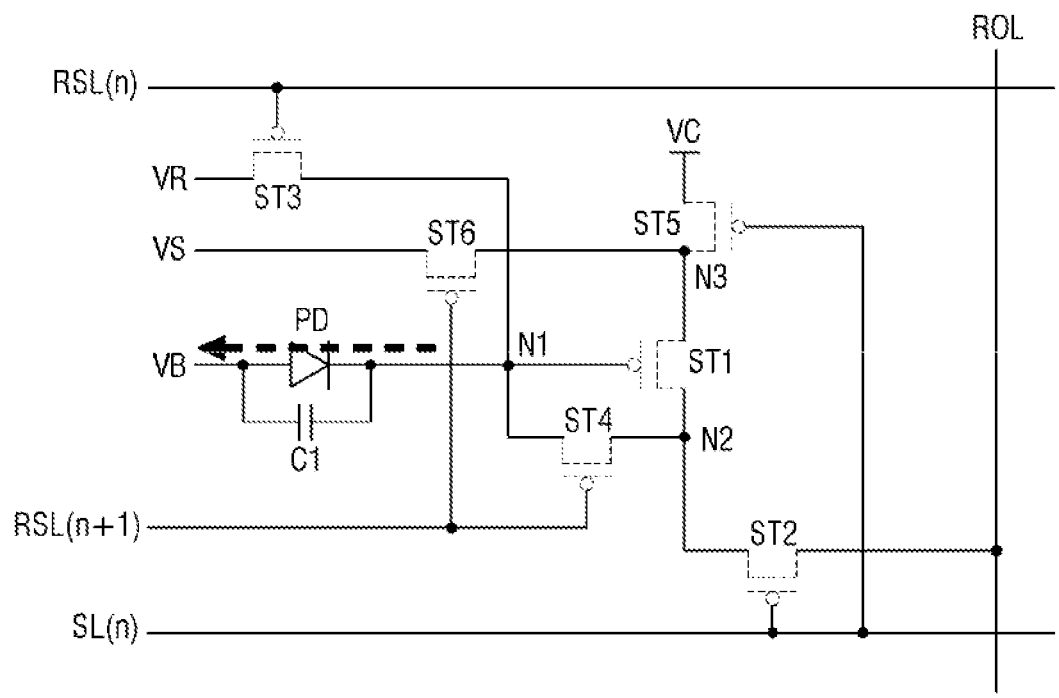
FIG. 11 illustrates an embodiment of the operation of the fingerprint sensor during a third period.
Figure 12:
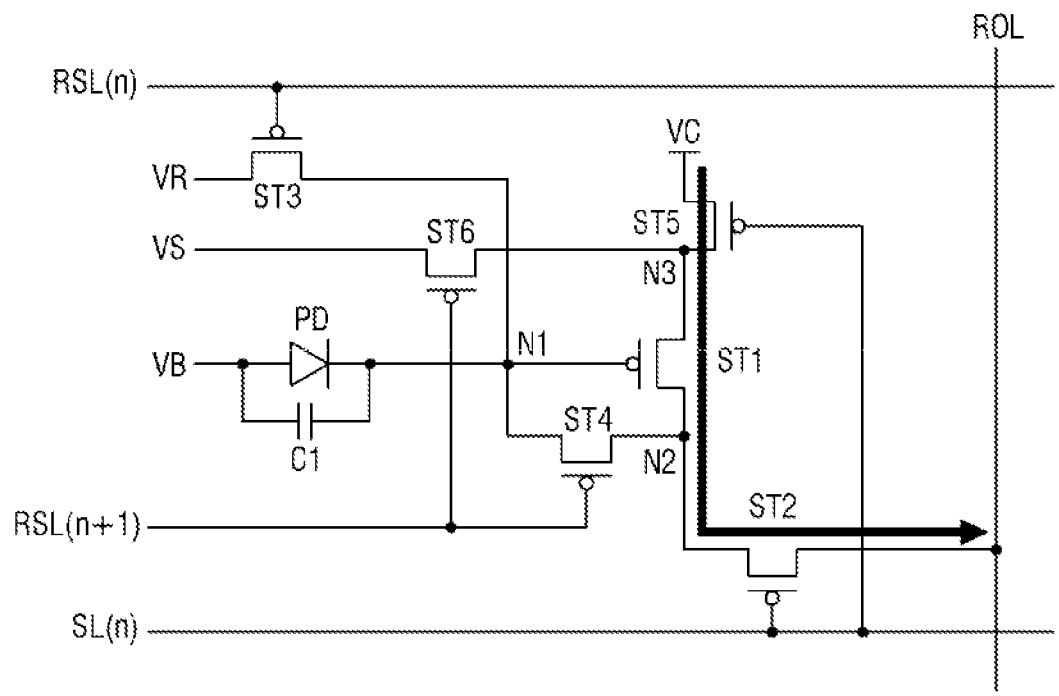
FIG. 12 illustrates an embodiment of the operation of the fingerprint sensor during a fourth period.

FIG. 8 is a waveform diagram of signals that may be supplied to the fingerprint sensor of FIG. 7 in accordance with one embodiment. FIG. 9 is a diagram showing an embodiment of an operation of a fingerprint sensor during a first period in a display device according to an exemplary embodiment. FIG. 10 is a diagram showing an embodiment of an operation of the fingerprint sensor during a second period in the display device according to the exemplary embodiment. FIG. 11 is a diagram showing an embodiment of an operation of the fingerprint sensor during a third period in the display device according to the exemplary embodiment. FIG. 12 is a diagram showing an embodiment of an operation of a fingerprint sensor during a fourth period in a display device according to an exemplary embodiment.

Referring to FIGS. 8 to 12, the fingerprint sensor FPS may be connected to a first reset line RSL(n), a second reset line RSL(n+1), and a scan line SL(n). When the fingerprint sensors FPS are driven at a predetermined frequency, one frame may include first to fourth periods t1 to t4.

Referring to FIG. 9 in conjunction with FIG. 8, the first reset line RSL(n) may supply a first reset signal RST(n) at a gate-on level during the first period t1. The third transistor ST3 may be turned on during the first period t1 based on the first reset signal RST(n), and may supply the reset voltage VR to the first node N1. Accordingly, the first node N1 (which corresponds to the gate electrode of the first transistor ST1) may be reset by reset voltage VR.

Referring to FIG. 10 in conjunction with FIG. 8, the second reset line RSL(n+1) may supply a second reset signal RST(n+1) at the gate-on level during a second period t2 after the first period t1. The sixth transistor ST6 may be turned on during the second period t2 based on the second reset signal RST(n+1), and may supply the sampling voltage VS to the third node N3. Immediately after the sixth transistor ST6 is turned on, the second node N2 (which corresponds to the source electrode of the first transistor ST1) may have the sampling voltage VS, and the first node N1 (which corresponds to the gate electrode of the first transistor ST1) may have the reset voltage VR.

In one embodiment, the sampling voltage VS may be greater than the reset voltage VR. In such case, the voltage Vsg between the source electrode and the gate electrode of the first transistor ST1 (or the difference between the voltage of the second node N2 and the voltage of the first node N1) may be greater than the threshold voltage Vth of the first transistor ST1, to thereby turn on the first transistor ST1. In addition, the fourth transistor ST4 may be turned on during the second period t2 based on the second reset signal RST(n+1), and may connect the second node N2 to the first node N1. Accordingly, the first transistor ST1 may be turned on until the gate electrode of the first transistor ST1 reaches the difference voltage VS-Vth between the sampling voltage VS and the threshold voltage Vth. As a result, the first node N1 (that corresponds to the gate electrode of the first transistor ST1) may be sampled by the sampling voltage VS.

Referring to FIG. 11 in conjunction with FIG. 8, the photodetector PD may receive light during a third period t3 after the second period t2. For example, the photodetector PD may not receive light if there is no physical contact of an object on the cover window 100. In this case, the fingerprint sensor FPS may apply a reverse bias between the first electrode and the second electrode of the photodetector PD. In one embodiment, the reverse bias refer to the case where the voltage of the first node N1 (which is the first electrode of a photodetector PD) is greater than the bias voltage VB applied to the second electrode of the photodetector PD. If the photodetector PD receives no light, the photodetector PD may have a voltage in the reverse direction between the first electrode and the second electrode, and the photodetector PD can cut off current between the first node N1 and the bias voltage line.

When an object (e.g., user's finger F) is brought into contact with the cover window 100, the photodetector PD may receive the second light L2 reflected by the ridges FR and/or the valleys FV of the finger F. The first light L1 output from the emission material layer EML is reflected by the ridges FR and/or the valleys FV of the finger F, and the reflected second light L2 may reach the photodetector PD of the fingerprint sensor layer FPSL. The photodetector PD may convert the energy of the second light L2 to an electrical signal (e.g., current or voltage) formed between the first electrode and the second electrode. The converted electrical signal may then flow from the first node N1 to the bias voltage line.

For example, when a reverse bias is applied between the first electrode and the second electrode of the photodetector PD, current may flow in the photodetector PD in the reverse direction in an amount proportional to the amount of the second light L2. Thus the voltage of the first node N1 may be decreased. Accordingly, when the photodetector PD receives the second light L2, the voltage of the first node N1 may be reduced and the magnitude of the sensing current (or the source-drain current) of the first transistor ST1 that flows during a fourth period t4 may be reduced. The sensing current of the first transistor ST1 may pass through the second transistor ST2 and may be applied to the sensor driver 430 as a sensing signal during the fourth period t4.

Referring to FIG. 12 in conjunction with FIG. 8, the scan line SL(n) may supply the scan signal SC(n) at the gate-on level during the fourth period t4 after the third period t3. The fifth transistor ST5 may be turned on during the fourth period t4 based on the scan signal SC(n), and may apply the common voltage VC to the third node N3. The first transistor ST1 may output a sensing current (or a source-drain current) based on the voltage of the first node N1.

For example, when the intensity of reflected light incident on the photodetector PD is relatively small, the magnitude of the sensing current may be relatively large. When the intensity of reflected light incident on the photodetector PD is relatively large, the magnitude of the sensing current may be relatively small. The second transistor ST2 may be turned on during the fourth period t4 based on the scan signal SC(n), and may connect the second node N2 with the read-out line ROL. Accordingly, the second transistor ST2 may supply the sensing current output from the first transistor ST1 to the read-out line ROL. The fingerprint sensor FPS may supply a sensing signal Rx by a sensing current to the sensor driver 430 through the read-out line ROL.

The sensor driver 430 may generate sensing data based on the sensing signal Rx received from the fingerprint sensors FPS. The main processor 710 may determine whether the sensing data corresponds to the ridges FR and/or the valleys FV of the finger F, thereby recognizing the pattern of a user's fingerprint.

Using the fingerprint sensors FPS (each of which, may include, in one non-limiting embodiment, first to sixth transistors ST1 to ST6 and the photodetector PD), the threshold voltage Vth characteristics of the first transistor ST1 of each of the fingerprint sensors FPS can be compensated for. For example, if the magnitude of the current flowing into the first transistor ST1 during the fourth period t4 is 1 μA or less, the magnitude of the sensing current corresponding to the ridges FR of the finger F can be clearly distinguished from the magnitude of the sensing current corresponding to the valleys of the finger F. The magnitudes of the current flowing into the first transistor ST1 may be different in another embodiment. Accordingly, the display device may compensate for dispersion of the first transistors of the plurality of fingerprint sensors by maintaining the voltage of the gate electrode of the first transistor connected to the photodetector PD. This may result in a substantial improvement in sensitivity of the fingerprint sensors.

Figure 13:
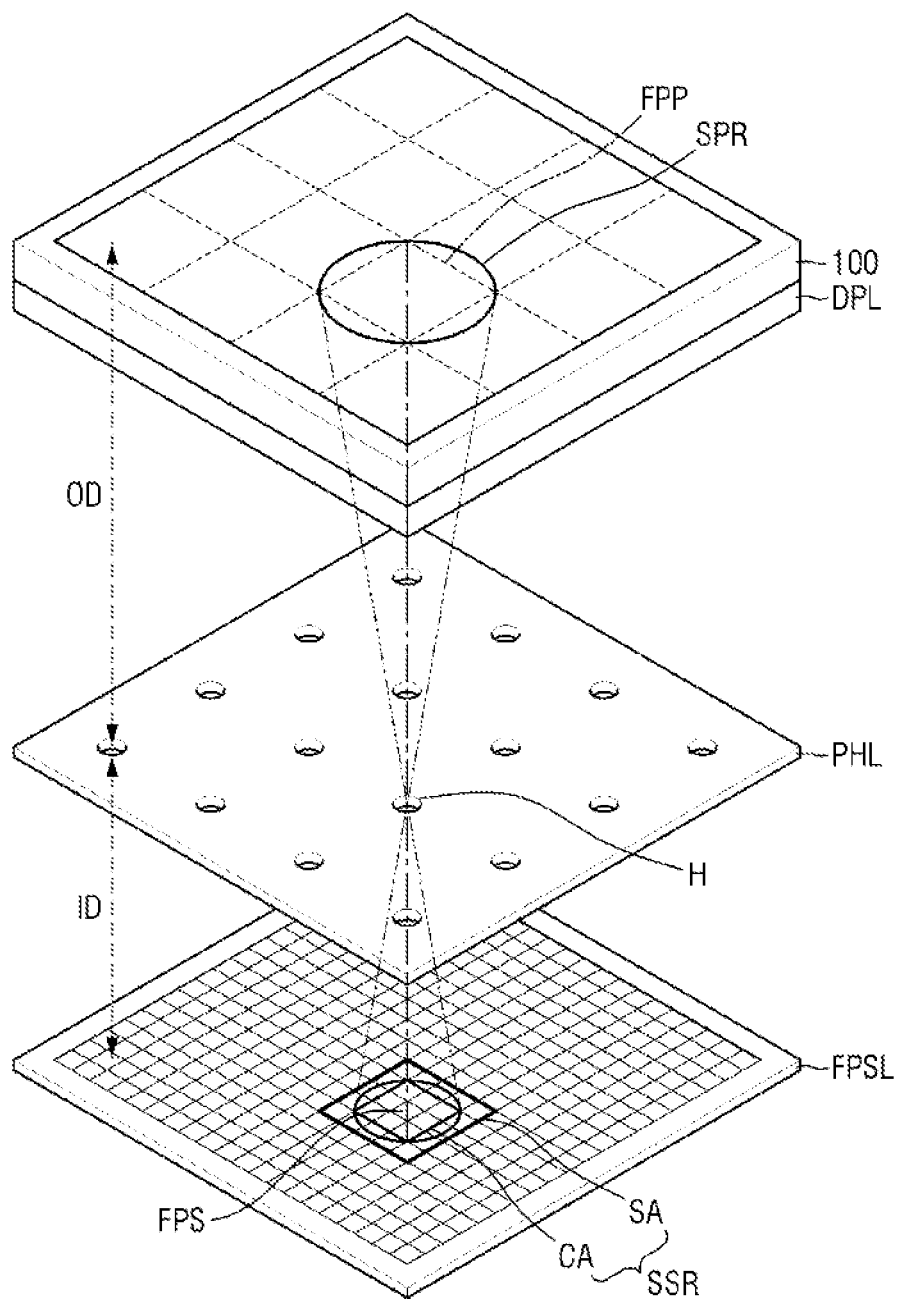
FIG. 13 illustrates an example of a path of reflected light in a display device.
Figure 14:
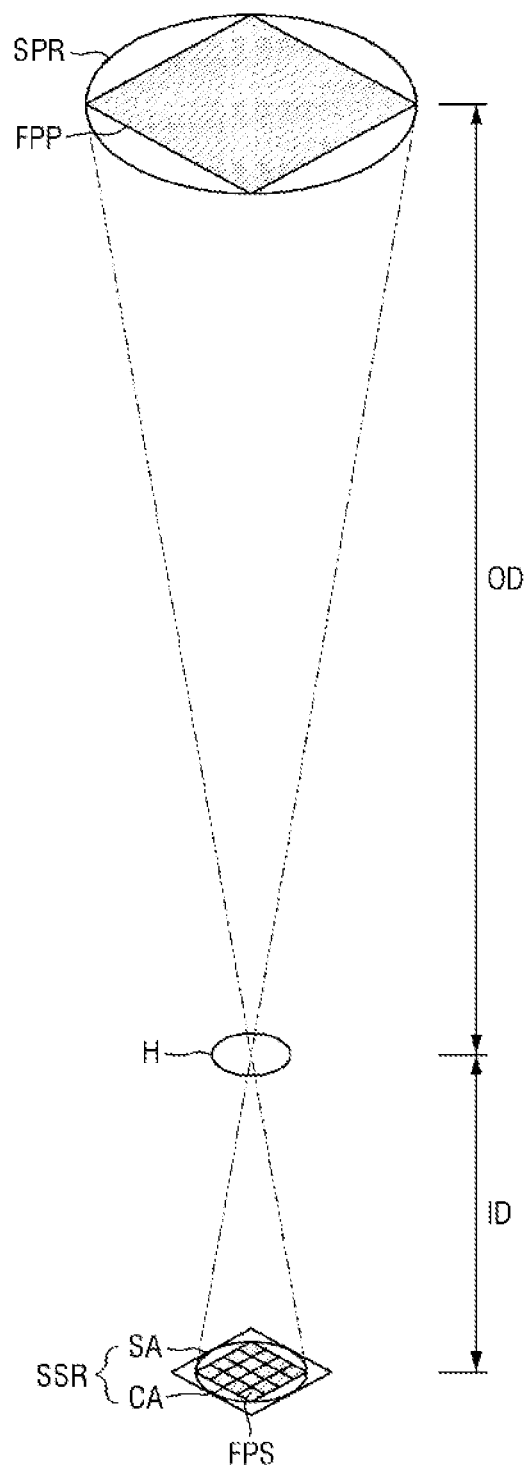
FIG. 14 illustrates an embodiment of a fingerprint pixel and a sensor pixel.

FIG. 13 is a perspective view showing a path of reflected light in a display device according to an exemplary embodiment. FIG. 14 is a diagram illustrating a fingerprint pixel and a sensor pixel of a display device according to an exemplary embodiment.

Referring to FIGS. 13 and 14 in view of FIG. 1, the display device 10 may include a cover window 100, a display layer DPL, an optical layer PHL, and a fingerprint sensor layer FPSL. The cover window 100 may include a plurality of fingerprint pixels FPP and a plurality of sampling regions SPR surrounding the fingerprint pixels FPP, respectively. The fingerprint sensor layer FPSL may include a plurality of fingerprint sensors FPS and a plurality of sensing regions SSR each including a plurality of fingerprint sensors FPS and corresponding to one fingerprint pixel FPP and one hole H.

One fingerprint pixel FPP on the cover window 100 may correspond to at least one fingerprint sensor FPS of the fingerprint sensor layer FPSL. One fingerprint pixel may correspond to, for example, 20 to 30 fingerprint sensors FPS, but may correspond to a different number of fingerprint sensors FPS in another embodiment. The sampling region SPR on the cover window 100 may correspond to sensing region SSR of the fingerprint sensor layer FPSL.

Each of the plurality of fingerprint pixels FPP may correspond to a respective one of the holes H of the optical layer PHL. In addition, each of the plurality of sensing regions SSR may correspond to one hole H of the optical layer PHL. For example, when the user's finger F is brought into contact with the cover window 100, each of the plurality of sampling regions SPR may reflect the first light L1 output from the display panel 300 and the second light L2 (reflected by each of the sampling regions SPR) may pass through a hole H of the optical layer PHL to reach the sensing region SSR of the fingerprint sensor layer FPSL. The plurality of holes H of the optical layer PHL may therefore serve as paths for the second light L2 reflected by the user's finger F. As a result, the plurality of fingerprint sensors FPS may sense the second light L2 reflected by the ridges FR and/or the valleys FV between the ridges FR of the finger F in contact with the sampling region SPR on the cover window 100.

The plurality of fingerprint sensors FPS may sense the second light L2 reflected by the ridges FR and/or the valleys FV of the finger F to generate a sensing signal. The sensing signal may then be supplied to the sensor driver 430. The sensor driver 430 may distinguish between a sensing signal corresponding to the ridges FR of the finger F and a sensing signal corresponding to the valleys FV of the finger F. Accordingly, the sensor driver 430 may merge sensing signals of the fingerprint sensors FPS to recognize a fingerprint pattern of a finger in contact with the sampling region SPR.

Each of the plurality of sensing regions SSR may include a central area CA and a surrounding area SA. The central area CA may include at least one fingerprint sensor FPS disposed in the center of the sensing region SSR. The second light L2 reflected by the user's finger F may mostly reach the central area CA. Accordingly, user's fingerprint information may be concentrated on at least one fingerprint sensor FPS of the central area CA.

The surrounding area SA may surround the central area CA and may include at least one fingerprint sensor FPS surrounding the central area CA. For example, some of the fingerprint sensors FPS in the surrounding area SA may receive the reflected second light L2, and some others of the fingerprint sensors FPS in the surrounding area SA may not receive the reflected second light L2. In one embodiment, the average intensity of the second light L2 reaching the fingerprint sensor FPS of the surrounding area SA may be less than the average intensity of the second light L2 reaching the fingerprint sensor FPS of the central area CA. Accordingly, the reflected second light L2 may reach relatively less the surrounding area SA. Although the fingerprint sensor FPS in the surrounding area SA may contain user's fingerprint information, it may include relatively less information than the fingerprint sensor FPS in the central area CA.

The display device 10 can sense the light reflected by the user's finger F through the fingerprint sensors FPS by adjusting the ratio between a fingerprint distance OD and a sensor distance ID. The fingerprint distance OD may refer to the distance between the surface of the cover window 100 (with which the user's finger F is in contact) and the center point of the hole H of the optical layer PHL. The sensor distance ID may refer to the distance between the center point of the hole H of the optical layer PHL and the fingerprint sensor FPS of the fingerprint sensor layer FPSL.

For example, light reflected from one end of the fingerprint pixel FPP on the cover window 100 may pass through the central point of the hole H to reach one end of the fingerprint sensor FPS. In addition, light reflected from the opposite end of the fingerprint pixel FPP on the cover window 100 may pass through the central point of the hole H to reach the other end of the fingerprint sensor FPS. Accordingly, the shape of the fingerprint directly in contact with the fingerprint pixel FPS and the image formed on the fingerprint sensor FPS may differ by 180 degrees. The sensor driver 430 may generate a fingerprint image by inverting the image formed on the fingerprint sensor FPS. In accordance with one embodiment, the display device 10 can improve the sensitivity of the fingerprint sensors FPS by adjusting the ratio between the fingerprint distance OD and the sensor distance ID and adjusting the arrangement and shape of the holes H of the optical layer PHL.

Figure 15:
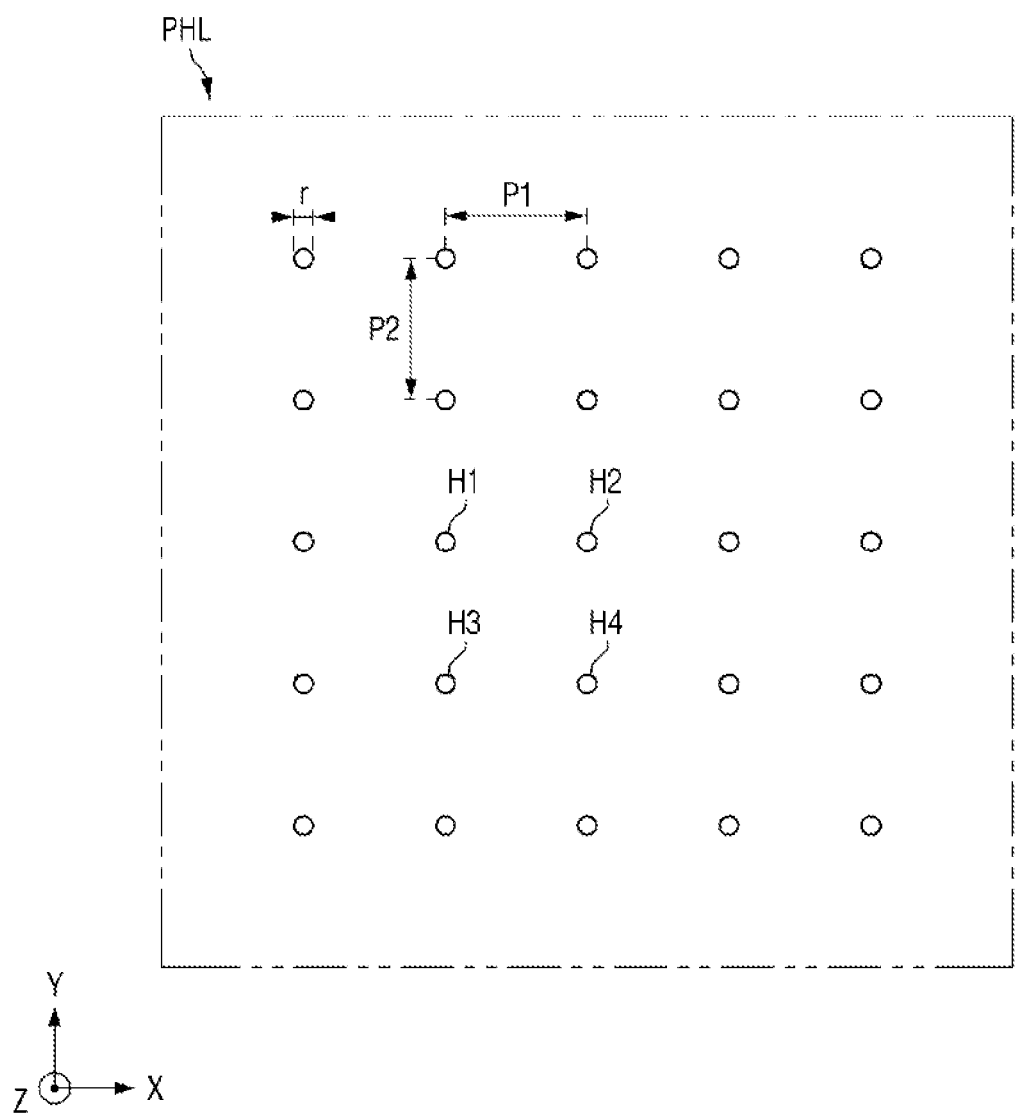
FIG. 15 illustrates an embodiment including an optical layer of a display device.

FIG. 15 is a plan view showing a light-blocking layer of a display device according to an exemplary embodiment. Referring to FIG. 15, the optical layer PHL may include a plurality of holes H having, for example, a circular shape. The diameter r of each of the holes H may range, for example, from 3 to 20 μm, but the diameter may lie in a different range in another embodiment.

The plurality of holes H may be arranged in the first direction (x-axis direction) to have a first pitch P1. The first pitch P1 may be, for example, 1.3 to 1.5 times the sensor distance ID, and in one case may be 1.3 times the sensor distance ID. The first pitch P1 may be different in another embodiment. The sensor distance ID may refer to the distance between the center point of the hole H of the optical layer PHL and the fingerprint sensor FPS of the fingerprint sensor layer FPSL.

The plurality of holes H may be arranged in the second direction (y-axis direction) to have a second pitch P2. The second pitch P2 may be equal to or different from the first pitch P1. The plurality of holes H may be arranged, for example, in parallel in the first direction (x-axis direction) and the second direction (y-axis direction). In one embodiment, the plurality of holes H may be arranged along the first pitch P1 and the second pitch P2, and may be aligned in directions other than the first direction (x-axis direction) and/or the second direction (y-axis direction).

In one embodiment, the first pitch P1 or the second pitch P2 may be proportional to the thickness of the first thin-film encapsulation layer TFEL1. As the thickness of the first thin-film encapsulation layer TFEL1 increases, the fingerprint distance OD may increase, and so may the areas of the fingerprint pixel FPP and the sampling area SPR. The first pitch P1 or the second pitch P2 of the plurality of holes H may be proportional to the thickness of the first thin-film encapsulation layer TFEL1 to adjust the ratio between the fingerprint distance OD and the sensor distance ID.

For example, the first pitch P1 or the second pitch P2 may be proportional to the distance between the light-emitting elements of the emission material layer EML or the distance between the pixels SP. As the distance between the light-emitting elements increases, the distance between the second lights L2 reflected by the finger F may also increase. Accordingly, the first pitch P1 or the second pitch P2 may be proportional to the distance between light-emitting elements or the distance between pixels SP so the plurality of holes H work as paths for the second lights L2.

The optical layer PHL may include first to fourth holes H1, H2, H3 and H4 adjacent to each other. For example, the first to fourth holes H1, H2, H3 and H4 of the optical layer PHL may be close to one another (e.g., less than a predetermined distance), and the sensing regions SSR corresponding to the first to fourth holes H1, H2, H3 and H4 of the optical layer PHL, respectively, may also be close to one another (e.g., less than a predetermined distance). Therefore, the second lights L2 reflected by the user's finger F may pass through the first to fourth holes H1, H2, H3 and H4 to mostly reach the sensing regions SSR close to each other.

The shape of the plurality of holes H is not limited to the circular shape shown in FIG. 15. In another embodiment, the plurality of holes H may have an elliptical shape, a polygonal shape or another shape, or a combination of different shapes. For example, in one embodiment, the plurality of holes H may have different shapes in the optical layer PHL.

Figure 16:
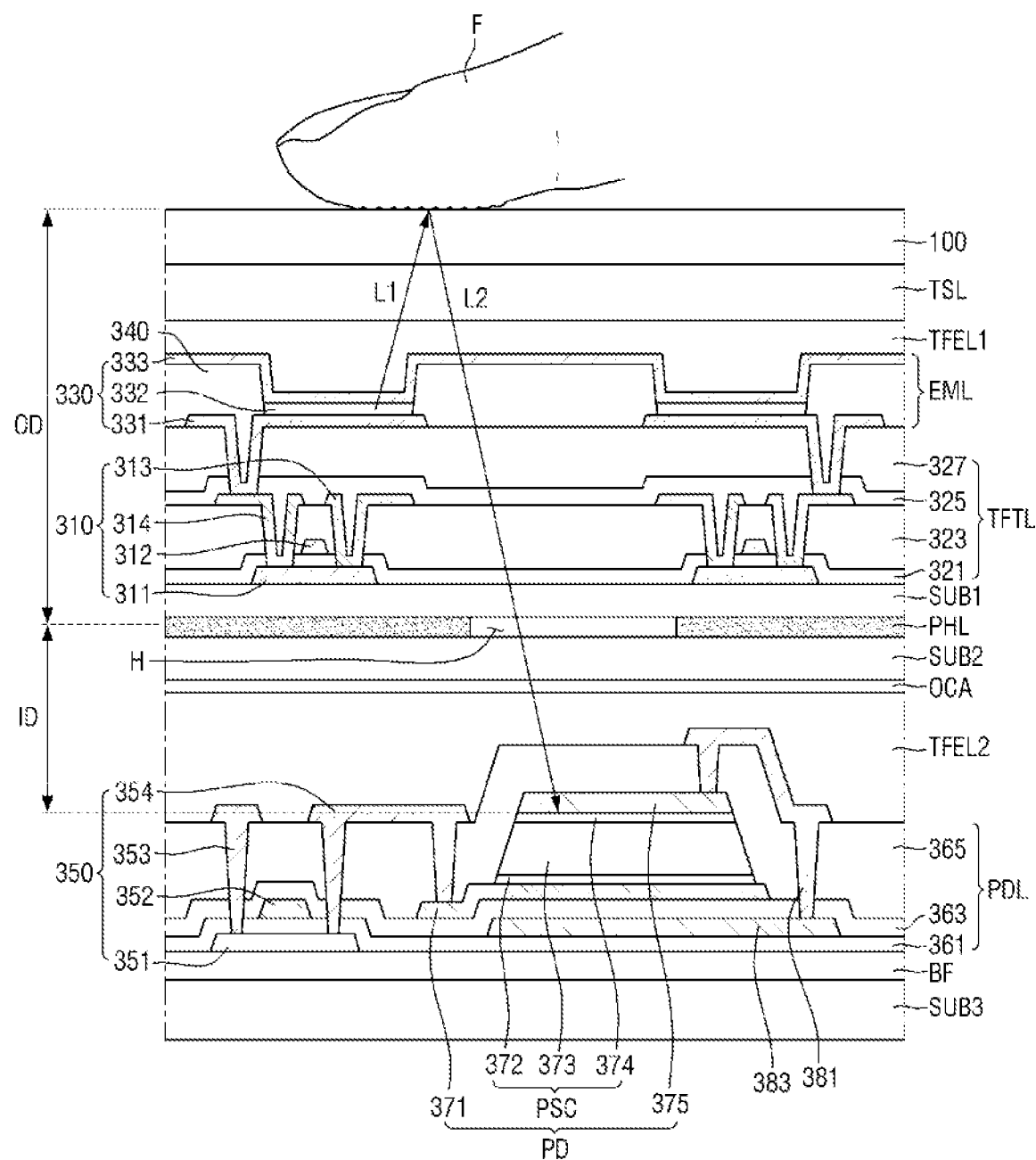
FIG. 16 illustrates an embodiment of a path of reflected light in a display device.

FIG. 16 is a cross-sectional view showing a path of reflected light in a display device according to an exemplary embodiment. Referring to FIG. 16, the display device 10 may include a first substrate SUB1, an optical layer PHL, a second substrate SUB2, a thin-film transistor layer TFTL, an emission material layer EML, and a first thin-film encapsulation layer TFEL1, a touch sensor layer TSL, a cover window 100, a third substrate SUB3, a buffer layer BF, a photodetector layer PDL, and a second thin-film encapsulation layer TFEL2.

The first substrate SUB1 may be a base substrate or a base member of the display layer DPL and may be made of an insulating material such as a polymer resin. The first substrate SUB1 may be a rigid substrate or a flexible substrate that may be bent, folded, or rolled. When the first substrate SUB1 is a flexible substrate, it may be made of polyimide (PI) or another material that allows for bending, folding, or rolling.

The optical layer PHL may cover the lower surface of the thin-film transistor layer TFTL and may be disposed between the first substrate SUB1 and the thin-film transistor layer TFTL, to block light incident on the thin-film transistor layer TFTL and an emission material layer EML. The optical layer PHL may include a plurality of holes H, which may serve as optical paths through which reflected light travels toward the fingerprint sensor layer FPSL (second light L2). The light L2 may be initially emitted from the emission material layer EML (first light L1) and then reflected from the object (e.g., finger of the user's body).

The second substrate SUB2 may be disposed on the optical layer PHL to support the thin-film transistor layer TFTL. The second substrate SUB2 may be made of an insulating material, e.g., a polymer resin.

The thin-film transistor layer TFTL may be disposed above the second substrate SUB2 and may include at least one thin-film transistor 310 for driving each of the plurality of pixels SP. The thin-film transistor layer TFTL may further include a gate insulator 321, an interlayer dielectric layer 323, a protective layer 325, and a planarization layer 327. At least one thin-film transistor 310 may include a semiconductor layer 311, a gate electrode 312, a source electrode 313 and a drain electrode 314.

The semiconductor layer 311 may be disposed on the second substrate SUB2 and may be disposed to overlap the gate electrode 312, the source electrode 313, and the drain electrode 314. The semiconductor layer 311 may be in direct contact with the source electrode 313 and the drain electrode 314, and may face the gate electrode 312 with the gate insulator 321.

The gate electrode 312 may be disposed on the gate insulator 321 and may overlap the semiconductor layer 311, with the gate insulator 321 interposed therebetween.

The source electrode 313 and the drain electrode 314 are disposed on the interlayer dielectric layer 323 and spaced apart from each other. The source electrode 313 may be in contact with one end of the semiconductor layer 311 through a contact hole formed in the gate insulator 321 and the interlayer dielectric layer 323. The source electrode 313 may be in contact with the other end of the semiconductor layer 311 through a contact hole formed in the gate insulator 321 and the interlayer dielectric layer 323. The drain electrode 314 may be in direct contact with a first electrode 331 of the light-emitting element 330 through a contact hole of the protective layer 325.

The gate insulator 321 may be disposed over the semiconductor layer 311. For example, the gate insulator 321 may be disposed over the semiconductor layer 311 and on the second substrate SUB2 and may insulate the semiconductor layer 311 from the gate electrode 312. The gate insulator 321 may include a contact hole penetrating through the source electrode 313 and a contact hole penetrating through the drain electrode 314.

The interlayer dielectric layer 323 may be disposed on the gate electrode 312. For example, the interlayer dielectric layer 323 may include the contact hole through which the source electrode 313 passes and the contact hole through which the drain electrode 314 passes. The contact holes of the interlayer dielectric layer 323 may be connected to the contact holes of the gate insulator 321.

The protective layer 325 may be disposed on the thin-film transistors 310 to protect the thin-film transistors 310. For example, the protective layer 325 may include a contact hole through which the first electrode 331 of the light-emitting element 330 passes.

The planarization layer 327 may be disposed on the protective layer 325 to provide a flat surface over the thin-film transistors 310. For example, the planarization layer 327 may include a contact hole through which the first electrode 331 of the light-emitting element 330 passes. The contact hole of the protective layer 325 and the contact hole of the planarization layer 327 may be connected to each other so as to penetrate the first electrode 331 of the light-emitting element 330.

The emission material layer EML may be disposed on the thin-film transistor layer TFTL and may include the light-emitting element 330 connected to the thin-film transistor 310 of the thin-film transistor layer TFTL.

The light-emitting element 330 may include a first electrode 331, an emissive layer 332, and a second electrode 333. The first electrode 331 may be disposed on the planarization layer 327. For example, the first electrode 331 may overlap the opening of the emission material layer EML defined by a pixel-defining layer 340. In addition, the first electrode 331 may be in contact with the drain electrode 314 of the thin-film transistor 310 through a contact hole formed in the planarization layer 327 and the protective layer 325. For example, the first electrode 331 may work as an anode of the light-emitting element 330.

The emissive layer 332 may be disposed on the first electrode 331 and may include a hole injecting layer, a hole transporting layer, a photosensitive layer, an electron blocking layer, an electron transporting layer, an electron injecting layer, etc. For example, the emissive layer 332 may include, but is not limited to, an organic emissive layer made of an organic material. If the emissive layer 332 is an organic emissive layer, the thin-film transistor 310 of the thin-film transistor TFTL may apply a predetermined voltage to the first electrode 331 of the light-emitting element 330, and the second electrode 333 of the light-emitting element 330 may receive a common voltage or cathode voltage. As a result, the holes and electrons may move to the organic emissive layer 332 through the hole transporting layer and the electron transporting layer, respectively, and combine in the organic emissive layer 332 to emit light.

The second electrode 333 may be disposed on the emissive layer 332. For example, the second electrode 333 may be implemented in the form of a common electrode extended across all of the pixels SP, instead of being disposed separately in each of the pixels SP.

The emission material layer EML may include a pixel-defining layer 340 defining a plurality of pixels SP. The first electrode 331 and the emissive layer 332 of the light-emitting element 330 may be spaced apart and insulated from each other by the pixel-defining layer 340.

The first thin-film encapsulation layer TFEL1 may be disposed on the emission material layer EML to cover the thin-film transistor layer TFTL and the emission material layer EML. The first thin-film encapsulation layer TFEL1 can prevent oxygen or moisture from permeating into the emission material layer EML.

The touch sensor layer TSL may be disposed on the first thin-film encapsulation layer TFEL1 and may include touch electrodes (for sensing a user's touch) and touch electrode lines for connecting the pads with the touch electrodes. The touch electrodes of the touch sensor layer TSL may be disposed in a touch sensing area overlapping the display area DA of the display panel 300.

The cover window 100 may be disposed at the top of the display panel 300 and may be disposed on the touch sensor layer TSL of the display panel 300. For example, the cover window 100 may be attached on the touch sensor layer TSL by an optically clear adhesive. The cover window 100 may be in direct contact with a user's finger F.

The fingerprint sensor layer FPSL may be disposed at the bottom of the display panel 300. For example, the fingerprint sensor layer FPSL may be disposed under the first substrate SUB1. The upper end of the first substrate SUB1 may face the display panel 300 or the optical layer PHL, and the lower end of the first substrate SUB1 may face the fingerprint sensor layer FPSL. For example, the upper surface of the fingerprint sensor layer FPSL may be attached on the lower surface of the first substrate SUB1 through an adhesive member OCA.

In one embodiment, the first substrate SUB1 may be omitted. In this case, the upper surface of the fingerprint sensor layer FPSL may be attached directly to the lower surface of the optical layer PHL by an adhesive member OCA. For example, when the user's finger F is brought into contact with the cover window 100, the first light L1 output from the emission material layer EML may be reflected by the ridges FR and/or valleys FV of the finger F, and the reflected second light L2 may pass through the holes H of the optical layer PHL to reach the fingerprint sensor layer FPSL disposed under the first substrate SUB1.

The fingerprint sensor layer FPSL may include a third substrate SUB3, a buffer layer BF, a photodetector layer PDL, and a second thin-film encapsulation layer TFEL2. The third substrate SUB3 may be a base substrate or a base member of the fingerprint sensor layer FPSL and may be made of an insulating material such as a polymer resin. The third substrate SUB3 may be a rigid substrate or a flexible substrate that may bend, fold, or roll. When the third substrate SUB3 is a flexible substrate, it may be made of polyimide (PI) or another material which allows for bending, folding, or rolling.

The buffer layer BF may be disposed on the third substrate SUB3 and may be formed of an inorganic film that can prevent or reduce the permeation of air or moisture. For example, the buffer layer BF may include a plurality of inorganic films stacked on one another alternately. The buffer layer BF may include, for example, multiple layers, which may include, for example, one or more inorganic layers of a silicon nitride layer, a silicon oxynitride layer, a silicon oxide layer, a titanium oxide layer and an aluminum oxide layer alternately stacked on one another.

The photodetector layer PDL may be disposed on the buffer layer BF and may include at least one switching transistor 350 for driving each of the plurality of fingerprint sensors FPS, and a photodetector PD connected to the at least one switching transistor 350.

At least one switching transistor 350 may include a semiconductor layer 351, a gate electrode 352, a source electrode 353 and a drain electrode 354. The semiconductor layer 351 may be disposed on the buffer layer BF. The semiconductor layer 351 may be disposed to overlap the gate electrode 352, the source electrode 353, and the drain electrode 354. The gate electrode 352 may be on the first insulating layer 361 and may overlap the semiconductor layer 351, with the first insulating layer 361 interposed therebetween. The source electrode 353 and the drain electrode 354 may be disposed on the third insulating layer 365 and spaced apart from each other. The drain electrode 354 may be in direct contact with the first electrode 371 of the photodetector PD through the contact hole of first to third insulating layers 361, 363 and 365.

The photodetector PD may include a first electrode 371, a photosensitive layer PSC, and a second electrode 375. The first electrode 371 of the photodetector PD may be disposed on the second insulating layer 363 and may be connected to the drain electrode 354 of the switching transistor 350 through a contact hole penetrating the third insulating layer 365. For example, the first electrode 371 may be made up of a single layer (e.g., including molybdenum (Mo), titanium (Ti), copper (Cu) or aluminum (Al), etc.) or may be made up of a stack structure (e.g., including aluminum and titanium (Ti/Al/Ti), a stack structure of aluminum and indium-tin-oxide ITO (ITO/Al/ITO), an APC alloy and a stack structure of a silver-palladium-copper (APC) alloy and ITO (ITO/APC/ITO)).

The photosensitive layer PSC may be disposed on the first electrode 371. For example, the photosensitive layer PSC may include an n-type semiconductor layer 372, an i-type semiconductor layer 373, and a p-type semiconductor layer 374 stacked on one another sequentially. When the photosensitive layer PSC is formed in a PIN structure including the n-type semiconductor layer 372, the i-type semiconductor layer 373 and the p-type semiconductor layer 374, the i-type semiconductor layer 373 may be depleted by the p-type semiconductor layer 374 and the n-type semiconductor layer 372, and an electric field may be generated inside the i-type semiconductor layer 373. In addition, holes and electrons generated by sunlight may be drifted by the electric field. Accordingly, the holes may be collected to the second electrode 375 through the p-type semiconductor layer 374, and the electrons may be collected to the first electrode 371 through the n-type semiconductor layer 372.

The p-type semiconductor layer 374 may be disposed closer to the incidence surface of the reflected light, and the n-type semiconductor layer 372 may be disposed farther from the incidence surface of the reflected light. Since the drift mobility of holes is lower than the drift mobility of electrons, the p-type semiconductor layer 374 is disposed closer to the incidence surface of the reflected light, thereby increasing or maximizing the efficiency of collecting the reflected light.

The second electrode 375 of the photodetector PD may be disposed on the p-type semiconductor layer 374 and may be connected to the first connection electrode 381 through a contact hole penetrating the third insulating layer 365. The second electrode 375 may include a transparent conductive material capable of transmitting light. For example, the second electrode 375 may include, but is not limited to, at least one of indium tin oxide (ITO), indium zinc oxide (IZO) and indium tin zinc oxide (ITZO).

The first connection electrode 381 may be disposed on the third gate insulating layer 365. For example, the first connection electrode 381 may be disposed on the third insulating layer 365 so that it is spaced apart from the source electrode 353 and the drain electrode 354. The first connection electrode 381 may have one end connected to the second electrode 375 of the photodetector PD through a contact hole penetrating the third insulating layer 365, and another end connected to a second connection electrode 383 through a contact hole penetrating through the second and third insulating layers 363 and 365.

The second connection electrode 383 may be disposed on the first insulating layer 361 to overlap the photodetector PD. For example, the second connection electrode 383 may be disposed on the same layer as the gate electrode 352 of the switching transistor 350. The second connection electrode 383 may be insulated from the first electrode 371 of the photodetector PD, with the second insulating layer 363 therebetween. The second connection electrode 383 may be connected to the first connection electrode 381 through a contact hole penetrating through the second and third insulating layers 363 and 365.

The photodetector layer PDL may further include first to third insulating layers 361, 363 and 365. The first insulating layer 361 may be disposed on the semiconductor layer 351. The first insulating layer 361 may cover the semiconductor layer 351 of the switching transistor 350 and the buffer layer BF and may insulate the semiconductor layer 351 from the gate electrode 352.

The second insulating layer 363 may be disposed on the gate electrode 352 of the switching transistor 350 and the second connection electrode 383. The second insulating layer 363 may cover the gate electrode 352, the second connection electrode 383, and the first insulating layer 361. The second insulating layer 363 may insulate each of the source electrode 353 and the drain electrode 354 from the gate electrode 352, and may insulate the first electrode 371 of the photodetector PD from the second connection electrode 383.

The third insulating layer 365 may be disposed on the photodetector PD and may cover the photodetector PD and the second insulating layer 363.

The second thin-film encapsulation layer TFEL2 may be disposed on the photodetector layer PDL and may cover the source electrode 353 and the drain electrode 354 of the switching transistor 350, the first connection electrode 381, and the third insulating layer 365. The second thin-film encapsulation layer TFEL2 can prevent or reduce oxygen or moisture from permeating into the photodetector layer PDL. The upper surface of the second thin-film encapsulation layer TFEL2 may be attached to the lower surface of the first substrate SUB1 by an adhesive member OCA.

The controllers, processors, drivers, units, and other signal generating and signal processing features of the embodiments disclosed herein may be implemented, for example, in non-transitory logic that may include hardware, software, or both. When implemented at least partially in hardware, the controllers, processors, drivers, units, and other signal generating and signal processing features may be, for example, any one of a variety of integrated circuits including but not limited to an application-specific integrated circuit, a field-programmable gate array, a combination of logic gates, a system-on-chip, a microprocessor, or another type of processing or control circuit.

When implemented in at least partially in software, the controllers, processors, drivers, units, and other signal generating and signal processing features may include, for example, a memory or other storage device for storing code or instructions to be executed, for example, by a computer, processor, microprocessor, controller, or other signal processing device. The computer, processor, microprocessor, controller, or other signal processing device may be those described herein or one in addition to the elements described herein. Because the algorithms that form the basis of the methods (or operations of the computer, processor, microprocessor, controller, or other signal processing device) are described in detail, the code or instructions for implementing the operations of the method embodiments may transform the computer, processor, controller, or other signal processing device into a special-purpose processor for performing the methods described herein.

Although described with reference to exemplary embodiments of the present disclosure, it will be understood that various changes and modifications of the present disclosure may be made by one ordinary skilled in the art or one having ordinary knowledge in the art without departing from the spirit and technical field of the present disclosure as hereinafter claimed. Hence, the technical scope of the present disclosure is not limited to the detailed descriptions in the specification but should be determined only with reference to the claims. The embodiments may be combined to form additional embodiments.

What is claimed is:

1. A fingerprint sensor comprising:
a photodetector;
a first transistor configured to connect a second node with a third node based on a voltage of a first node, the first node connected between a first electrode of the photodetector and a gate of the first transistor;
a second transistor configured to connect the second node with a read-out line based on a scan signal;
a third transistor configured to supply a reset voltage to the first node based on a first reset signal; and
a fourth transistor configured to connect the first node with the second node based on a second reset signal.

2. The fingerprint sensor of claim 1, wherein:
the first electrode of the photodetector is connected to a gate electrode of the first transistor, and
a second electrode of the photodetector is configured to receive a bias voltage.

3. A fingerprint sensor, comprising:
a photodetector;
a first transistor configured to connect a second node with a third node based on a voltage of a first node, the first node corresponding to a first electrode of the photodetector;
a second transistor configured to connect the second node with a read-out line based on a scan signal;
a third transistor configured to supply a reset voltage to the first node based on a first reset signal;
a fourth transistor configured to connect the first node with the second node based on a second reset signal;
a fifth transistor configured to supply a common voltage to the third node based on the scan signal; and
a sixth transistor configured to supply a sampling voltage to the third node based on the second reset signal.

4. The fingerprint sensor of claim 3, wherein the third transistor is configured to turn on during a first period to supply the reset voltage to the first node.

5. The fingerprint sensor of claim 4, wherein the fourth transistor is configured to turn on during a second period after the first period, to connect the first node with the second node.

6. The fingerprint sensor of claim 5, wherein the photodetector is configured to receive reflected light during a third period after the second period, to allow flow of a current of the first node.

7. The fingerprint sensor of claim 6, wherein the fifth transistor is configured to turn on during a fourth period after the third period, to apply the common voltage to the third node.

8. The fingerprint sensor of claim 6, wherein the first transistor is configured to supply an output current to the second node based on a voltage of the first node during a fourth period after the third period.

9. The fingerprint sensor of claim 6, wherein the second transistor is configured to connect the second node with the read-out line during a fourth period after the third period.

10. The fingerprint sensor of claim 4, wherein the sixth transistor is configured to turn on during a second period after the first period, to apply the sampling voltage to the third node.

11. A display device, comprising:
a display layer configured to emit light to display an image;
a fingerprint sensor layer on a surface of the display layer, the fingerprint sensor layer comprising a plurality of fingerprint sensors, each of the plurality of fingerprint sensors configured to receive reflected light to generate a sensing signal; and
a sensor driver configured to receive the sensing signals from the plurality of fingerprint sensors through corresponding ones of a plurality of read-out lines, wherein each of the plurality of fingerprint sensors comprises:
a photodetector;
a first transistor configured to connect a second node with a third node based on a voltage of a first node connected between a first electrode of the photodetector and a gate of the first transistor;
a second transistor configured to connect the second node with a corresponding one of the plurality of the read-out lines based on a scan signal;
a third transistor configured to supply a reset voltage to the first node based on a first reset signal; and
a fourth transistor configured to connect the first node with the second node based on a second reset signal.

12. The display device of claim 11, further comprising:
an optical layer between the display layer and the fingerprint sensor layer,
wherein the optical layer comprises a plurality of holes.

13. A display device, comprising:
a display layer configured to emit light to display an image;
a fingerprint sensor layer on a surface of the display layer, the fingerprint sensor layer comprising a plurality of fingerprint sensors, each of the plurality of fingerprint sensors configured to receive reflected light to generate a sensing signal; and
a sensor driver configured to receive the sensing signals from the plurality of fingerprint sensors through corresponding ones of a plurality of read-out lines, wherein each of the plurality of fingerprint sensors comprises:
a photodetector;
a first transistor configured to connect a second node with a third node based on a voltage of a first node that corresponds to a first electrode of the photodetector;
a second transistor configured to connect the second node with a corresponding one of the plurality of the read-out lines based on a scan signal;
a third transistor configured to supply a reset voltage to the first node based on a first reset signal;
a fourth transistor configured to connect the first node with the second node based on a second reset signal;
a fifth transistor configured to supply a common voltage to the third node based on the scan signal; and
a sixth transistor configured to supply a sampling voltage to the third node based on the second reset signal.

14. The display device of claim 13, wherein the third transistor is configured to turn on during a first period to supply the reset voltage to the first node.

15. The display device of claim 14, wherein:
the fourth transistor is configured to turn on during a second period after the first period to connect the first node with the second node, and the sixth transistor is configured to turn on for the second period to apply the sampling voltage to the third node.

16. The display device of claim 15, wherein:
the first electrode of the photodetector is connected to a gate electrode of the first transistor,
a second electrode of the photodetector is configured to receive a bias voltage, and
the photodetector is configured to receive the reflected light during a third period after the second period, to allow a current to flow from the first electrode to the second electrode.

17. The display device of claim 16, wherein:
the fifth transistor is configured to supply the common voltage to the third node during a fourth period after the third period,
the first transistor is configured to supply an output current to the second node based on the voltage of the first node during the fourth period, and
the second transistor is configured to connect the second node with the read-out line during the fourth period.

18. A display device, comprising:
a display layer configured to emit light to display an image;
a fingerprint sensor layer on a surface of the display layer, the fingerprint sensor layer comprising a plurality of fingerprint sensors, each of the plurality of fingerprint sensors configured to receive reflected light to generate a sensing signal; and
a sensor driver configured to receive the sensing signals from the plurality of fingerprint sensors through corresponding ones of a plurality of read-out lines, wherein each of the plurality of fingerprint sensors comprises:
a photodetector;
a first transistor configured to connect a second node with a third node based on a voltage of a first node that corresponds to a first electrode of the photodetector;
a second transistor configured to connect the second node with a corresponding one of the plurality of the read-out lines based on a scan signal;
a third transistor configured to supply a reset voltage to the first node based on a first reset signal; and
a fourth transistor configured to connect the first node with the second node based on a second reset signal, wherein the first electrode of the photodetector is disposed on a base of the fingerprint sensor layer and is connected to a first electrode of the third transistor or a first electrode of the fourth transistor.

19. The display device of claim 18, wherein the photodetector comprises:
a photosensitive layer on a surface of the first electrode; and
a second electrode disposed on a surface of the photosensitive layer and configured to receive a bias voltage.

20. The display device of claim 19, wherein the second electrode comprises a transparent conductive layer.

* * * * *